US011550035B2

(12) United States Patent
Fields et al.

(10) Patent No.: US 11,550,035 B2
(45) Date of Patent: Jan. 10, 2023

(54) MODULAR SENSOR ASSEMBLY FOR VEHICLES

(71) Applicant: Woven Planet North America, Inc., Los Altos, CA (US)

(72) Inventors: Eric Daniel Fields, Oakland, CA (US); Alexander Charles Granieri, Palo Alto, CA (US); Alfred Charles Jones, II, San Jose, CA (US); Marco Antonio Marroquín, San Mateo, CA (US); Kevin David Page, Mountain View, CA (US)

(73) Assignee: Woven Planet North America, Inc., Los Altos, CA (US)

( * ) Notice: Subject to any disclaimer, the term of this patent is extended or adjusted under 35 U.S.C. 154(b) by 385 days.

(21) Appl. No.: 16/835,068

(22) Filed: Mar. 30, 2020

(65) Prior Publication Data

US 2021/0302541 A1    Sep. 30, 2021

(51) Int. Cl.
  *G01S 7/481*  (2006.01)
  *G01S 7/02*   (2006.01)
  (Continued)

(52) U.S. Cl.
  CPC ............ *G01S 7/4813* (2013.01); *B60R 11/04* (2013.01); *G01S 7/02* (2013.01); *H05K 7/14* (2013.01);
  (Continued)

(58) Field of Classification Search
  CPC ... B60R 11/04; B60R 2011/004; B60R 11/00; B60R 2300/105; B60R 2001/1223;
  (Continued)

(56) References Cited

U.S. PATENT DOCUMENTS 10,766,430 B2 *   9/2020  Frederick ............... B60R 11/00
2017/0305360 A1  10/2017  Zajac
(Continued)

FOREIGN PATENT DOCUMENTS

CN    108664029 A    10/2018
CN    110386073 A    10/2019
(Continued)

OTHER PUBLICATIONS

International Searching Authority, International Search Report and Written Opinion, PCT/US2021/024367, dated Jul. 20, 2021.

*Primary Examiner* — Olumide Ajibade Akonai
(74) *Attorney, Agent, or Firm* — Christopher G. Darrow; Darrow Mustafa PC

(57) ABSTRACT

In one embodiment, a modular sensor assembly configured for mounting on a vehicle includes a first set of sensors and a second set of sensors. The modular sensor assembly includes a coordinate frame baseplate including a continuous surface, and sensor mounting elements coupled to the continuous surface for mounting the first set of sensors at a first height. The coordinate frame baseplate includes a sensor platform configured for mounting the second set of sensors at a second height. The first set of sensors and the second set of sensors are coupled to the coordinate frame baseplate so as to impart a common coordinate frame for the first set of sensors mounted at the first height and the second set of sensors mounted at the second height. The modular sensor assembly includes a bridging support structure coupled to the coordinate frame baseplate and capable of being mounted on a vehicle.

20 Claims, 12 Drawing Sheets

(51) Int. Cl.
    *H05K 7/14*    (2006.01)
    *B60R 11/04*   (2006.01)
    *B60R 11/00*   (2006.01)

(52) U.S. Cl.
    CPC ......... *B60R 2011/004* (2013.01); *G01S 7/027* (2021.05)

(58) Field of Classification Search
    CPC ......... G01S 13/931; G01S 2013/93273; G01S 17/931; G01S 7/027; G01S 7/4813; G01S 2013/93274; G01S 2013/93271; G01S 2013/9327; G01S 2013/93272; G01S 2015/937; B60W 2420/52; G01D 11/245
    See application file for complete search history.

(56) References Cited

U.S. PATENT DOCUMENTS

| | | | |
|---|---|---|---|
| 2018/0015886 A1 | 1/2018 | Frank et al. | |
| 2018/0106883 A1* | 4/2018 | Unveren | G01S 7/02 |
| 2018/0257582 A1* | 9/2018 | Fan | G01S 19/45 |
| 2019/0315409 A1* | 10/2019 | Ghannam | B60R 11/00 |
| 2020/0018826 A1* | 1/2020 | Cao | G01S 7/4813 |
| 2020/0156576 A1* | 5/2020 | Kataoka | B62D 25/16 |
| 2021/0026019 A1* | 1/2021 | Gahagan | G01S 7/003 |

FOREIGN PATENT DOCUMENTS

| | | | | |
|---|---|---|---|---|
| EP | 3527437 A1 * | 8/2019 | | B60R 11/00 |
| JP | 2005-504679 A | 2/2005 | | |

\* cited by examiner

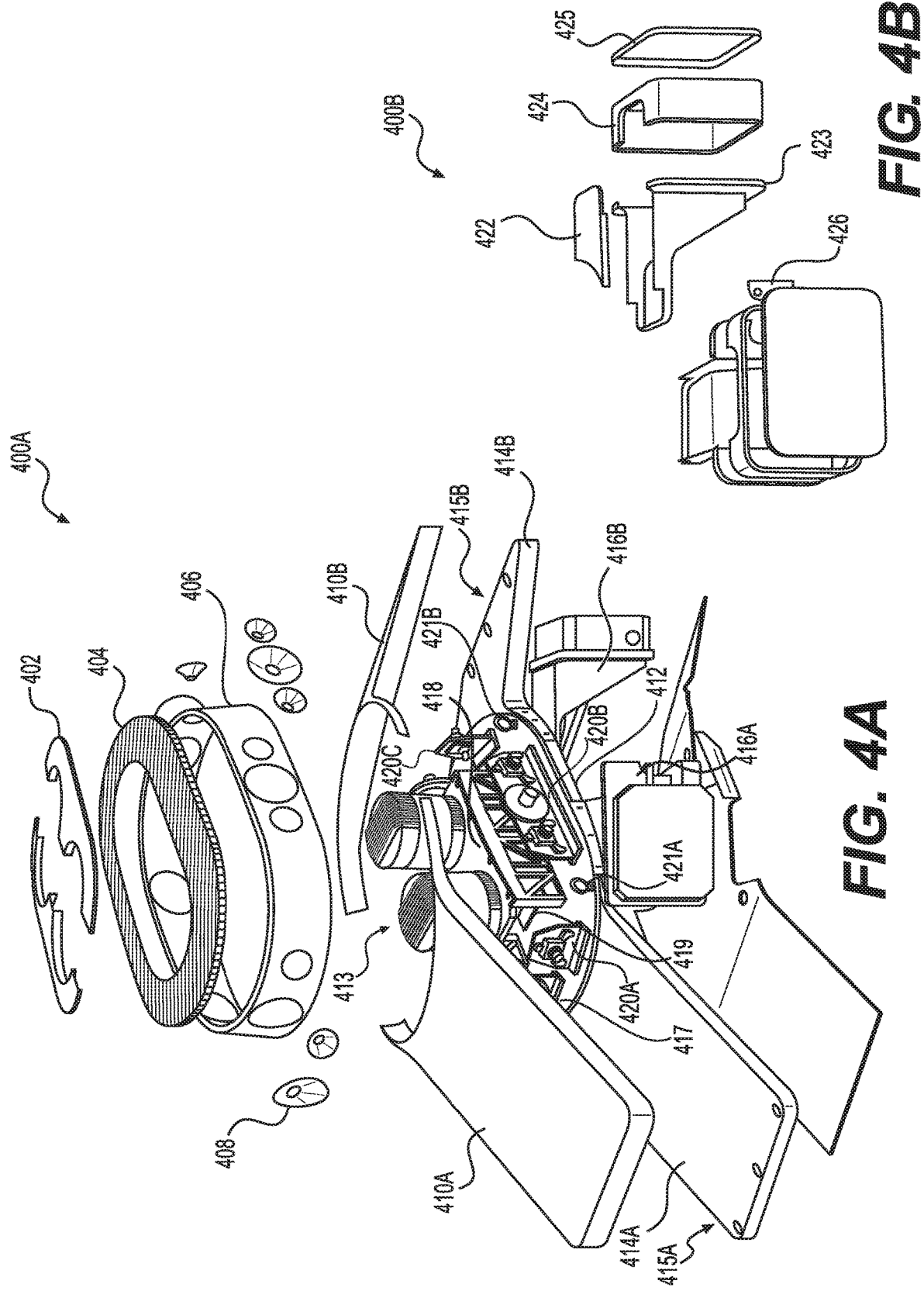

MODULAR SENSOR ASSEMBLY FOR VEHICLES

BACKGROUND

Autonomous or semi-autonomous vehicles may allow for the function of a human driver to be supplemented or completely replaced by one or more computer-based driving systems. Thus, as it may be appreciated, autonomous or semi-autonomous vehicles may typically rely upon on a number of sensors for determining an operational design domain (ODD), or an environment in which the autonomous or semi-autonomous vehicle may be optimally and safely deployed. For example, the particular sensors determined to be suitable for the ODD may be selected and included as part of a dedicated sensor setup installed on the vehicle. Indeed, the sensor setup may act as the "eye" of the autonomous or semi-autonomous vehicle, incessantly monitoring the environment surrounding the vehicle. As such, many sensor setups may often include bulky and cumbersome structures that may be distributed across the entire rooftop of the vehicle. Additionally, the manner in which the sensor setup is positioned and distributed across the rooftop may be a function of sensor setup height and sensor sight distance. Generally, the higher the sensor setup is positioned on the rooftop of the vehicle, the greater the sensor sight distance that may be achieved.

However, while increasing sensor setup height may increase sensor sight distance, a sensor setup disposed too highly above the vehicle may lead to the vehicle encountering a number of clearance hindrances, which may limit the testing capabilities and overall utility and aesthetics of the vehicle. Furthermore, such bulky, distributed sensor setups may adversely impact the overall weight of the vehicle, further limiting driving performance and passenger capacity. Still further, these bulky, distributed sensor setups may be suited only for isolated calibrations, in which a calibration is performed for each and every autonomous or semi-autonomous vehicle individually. Finally, due to the immense size and complexity associated with such bulky, distributed sensor setups, these sensor setups may not rather easily be removed from the vehicle once installed, limiting opportunities for efficient upgrading and retrofitting. It may be thus useful to improve sensor setups for autonomous or semi-autonomous vehicles.

BRIEF DESCRIPTION OF THE DRAWINGS

FIG. 4A illustrates an exploded view of one or more mechanical components of a modular sensor assembly.

FIG. 4B illustrates an exploded view of a radar housing of a modular sensor assembly.

DESCRIPTION OF EXAMPLE EMBODIMENTS

Figure 1:
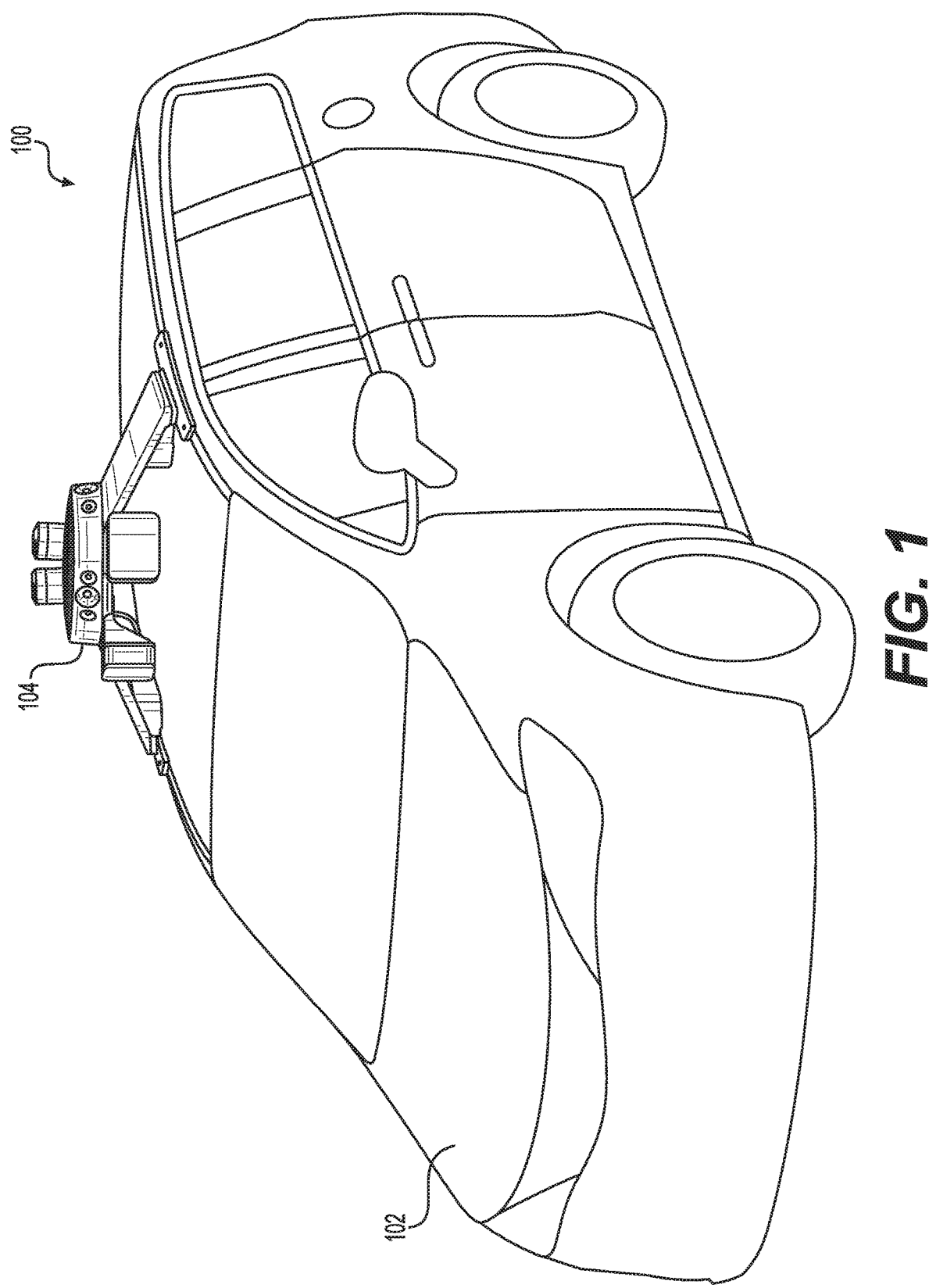
FIG. 1 illustrates an example autonomous or semi-autonomous vehicle environment.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described. In addition, the embodiments disclosed herein are only examples, and the scope of this disclosure is not limited to them. Certain embodiments may include all, some, or none of the components, elements, features, functions, operations, or steps of the embodiments disclosed above. Embodiments according to the invention are in particular disclosed in the attached claims directed to a method, a storage medium, a system and a computer program product, wherein any feature mentioned in one claim category, e.g., method, can be claimed in another claim category, e.g., system, as well. The dependencies or references back in the attached claims are chosen for formal reasons only. However, any subject matter resulting from a deliberate reference back to any previous claims (in particular multiple dependencies) can be claimed as well, so that any combination of claims and the features thereof are disclosed and can be claimed regardless of the dependencies chosen in the attached claims. The subject-matter which can be claimed comprises not only the combinations of features as set out in the attached claims but also any other combination of features in the claims, wherein each feature mentioned in the claims can be combined with any other feature or combination of other features in the claims. Furthermore, any of the embodiments and features described or depicted herein can be claimed in a separate claim and/or in any combination with any embodiment or feature described or depicted herein or with any of the features of the attached claims.

Autonomous or semi-autonomous vehicles may allow for the function of a human driver to be supplemented or completely replaced by one or more computer-based driving systems. Thus, as it may be appreciated, autonomous or semi-autonomous vehicles may typically rely upon a number of sensors for determining an operational design domain (ODD), or an environment in which the autonomous or semi-autonomous vehicle may be optimally and safely deployed. For example, the particular sensors determined to be suitable for the ODD may be selected and included as part of a dedicated sensor setup installed on the vehicle. Indeed, the sensor setup may act as the "eye" of the autonomous or semi-autonomous vehicle, incessantly monitoring the environment surrounding the vehicle. As such, many sensor setups often include bulky and cumbersome structures that may be distributed across the entire rooftop of the vehicle. Additionally, the manner in which the sensor setup is positioned and distributed across the rooftop may be a function of sensor setup height and sensor sight distance. Generally, the higher the sensor setup is positioned on the rooftop of the vehicle, the greater the sensor sight distance that may be achieved.

However, while increasing sensor setup height may increase sensor sight distance, a sensor setup disposed too highly above the vehicle may lead to the vehicle encountering a number of clearance hindrances, which may limit the testing capabilities and overall utility and aesthetics of the vehicle. Furthermore, such bulky, distributed sensor setups may adversely impact the overall weight of the vehicle, further limiting driving performance and passenger capacity. Still further, these bulky, distributed sensor setups may be suited only for isolated calibrations, in which a calibration is performed for each and every autonomous or semi-autonomous vehicle individually. Finally, due to the immense size and complexity associated with such bulky, distributed sensor setups, these sensor setups may not easily be removed from the vehicle once installed, limiting opportunities for efficient upgrading and retrofitting. Thus, it may be useful to improve sensor setups for autonomous or semi-autonomous vehicles.

Accordingly, the present embodiments relate to a modular and centralized sensor assembly for autonomous or semi-autonomous vehicles. In certain embodiments, the modular sensor assembly may include a coordinate frame baseplate on which a number of closely collocated (e.g., to preclude possible parallax and to include as a kit as many sensors as desired onto the coordinate frame baseplate) sensors may be disposed and/or coupled thereto. It should be appreciated that, in other embodiments, the number of sensors may not be closely collocated, and, instead, may be arranged in a distributed manner on the coordinate frame baseplate. For example, in one embodiment, the coordinate frame baseplate may include, for example, a stiffened and flat metal (e.g., aluminum, aluminum alloy, anodized aluminum, copper, copper-clad invar, and so forth) baseplate that may be utilized as a support structure for the number of closely collocated sensors and to impart a common coordinate frame for the number of closely collocated sensors. Specifically, in some embodiments, the coordinate frame baseplate may impart a common coordinate frame (e.g., a singular measurement reference frame) by which a sensor calibration and/or sensor data fusion of the number of closely collocated sensors may be performed based thereon and independently from a vehicle. Further, in one embodiment, the coordinate frame baseplate may include one or more individually designated calibration locations for each of the number of closely collocated sensors of various sensor modalities, such as one or more combinations of LiDAR sensors, cameras, radars, inertial measurement units (IMUs), or other similar sensor devices that may be utilized to monitor an environment surrounding the autonomous or semi-autonomous vehicle. Indeed, because the coordinate frame baseplate may include one or more individually designated calibration locations, the coordinate frame baseplate may include a modular and retrofittable design, such that any of the sensors may be interchanged without necessarily having to perform a recalibration.

In certain embodiments, the coordinate frame baseplate may include a circular or elliptical body portion, which may include a continuous surface (e.g., flat surface) and a platform surface coupled to the body portion and overlaying (e.g., overtopping) the continuous surface. In one embodiment, the continuous surface may include a number of metal mounting elements disposed on the continuous surface for mounting a set of cameras at a particular first height. The particular first height may be selected for maximizing sight coverage (e.g., field of view (FOV)) and precluding possible occlusion of the sight coverage (e.g., FOV) for the set of cameras. Similarly, in some embodiments, the platform surface may be utilized to mount a set of LiDAR sensors at a second particular height with respect to the continuous surface. The second particular height may be selected for maximizing sensor coverage (e.g., FOV) and precluding possible occlusion of the sensor coverage (e.g., FOV) for the set of LiDAR sensors. The differing heights may further prevent any interference and/or undesirable overlap between the sensor coverage (e.g., FOV) for the set of LiDAR sensors and the sight coverage (e.g., FOV) for the set of cameras. In some embodiments, the set of cameras and the set of LiDAR sensors may be arrangeably coupled to the coordinate frame baseplate to provide a common coordinate frame (e.g., a measurement reference frame) for the set of cameras mounted, for example, at the first particular height and the second set of LiDAR sensors mounted, for example, at the second particular height. Specifically, the coordinate frame baseplate may include one or more other individually designated locations (e.g., determined based on one or more structural analyses and sensor FOV optimization analyses) for the set of cameras and the set of LiDAR sensors that may be selected to both maximize sensor coverage (e.g., FOV) and to balance a weight distribution of the coordinate frame baseplate.

In certain embodiments, the modular sensor assembly may also include a first bracket component and a second bracket component. In some embodiments, the first bracket component and the second bracket component may each include a metal (e.g., aluminum, aluminum alloy, anodized aluminum) attachment component that may be utilized to respectively secure a first radar and a second radar to the coordinate frame baseplate. For example, in one embodiment, the first bracket component may be mounted at a first end to the coordinate frame baseplate and mounted at a second end to the first radar. Similarly, the second bracket component may be mounted at a first end to the coordinate frame baseplate and mounted at a second end to the second radar. In one embodiment, the first bracket component may be mounted at the first end to a first portion of a perimeter of the coordinate frame baseplate, such that the first bracket component may mount the first radar at a third particular height. Likewise, the second bracket component may be mounted at a first end to a second portion of the perimeter of the coordinate frame baseplate, such that the second bracket component may mount the second radar at the third particular height. Thus, the first bracket component and the second bracket component may be mounted to the coordinate frame baseplate to provide a common coordinate frame for the first radar and the second radar at the third height.

In certain embodiments, based on the common coordinate frame imparted by the coordinate frame baseplate, a calibration of the set of cameras, the set of LiDAR sensors, the first radar, and the second radar prior to disposing the coordinate frame baseplate onto a rooftop of any vehicle (e.g., independently of the vehicle). For example, in some embodiments, prior to disposing the modular sensor assembly onto a rooftop of vehicle, the set of cameras may be calibrated to a target calibration position corresponding to the common coordinate frame (e.g., a measurement reference frame) as imparted by the coordinate frame baseplate, the set of LiDAR sensors may be calibrated to the target calibration position corresponding to the common coordinate frame as imparted by the coordinate frame baseplate, and the first radar and the second radar may be calibrated to the target calibration position corresponding to the common coordinate frame as imparted by the coordinate frame baseplate.

In certain embodiments, the modular sensor assembly may further include a first bridging component and a second bridging component that may each be suitable for detachably coupling (e.g., on a first end of the respective first bridging component and second bridging component) to respective rails on either side atop the vehicle (e.g., on the rooftop of the vehicle). The first bridging component and the second bridging component may be coupled (e.g., on a second opposing end of the respective first bridging component and second bridging component) to the coordinate frame baseplate on opposite sides. Particularly, the first bridging component and the second bridging component may each be respectively coupled to the coordinate frame baseplate at a particular slope (e.g., approximately 15°, approximately 30°, approximately 45°, approximately 60°, approximately 75°, or other similar acute angle), such that the coordinate frame baseplate may be elevated to a predetermined physical height H (e.g., a height of less than or equal to approximately 8 feet [ft.], a height of less than or equal to approximately 7.5 ft., a height of less than or equal to approximately 7 ft., a height of less than or equal to approximately 6.5 ft., a height of less than or equal to approximately 6 ft., and so on and so forth) with respect to the vehicle. In one embodiment, the slope at which the first bridging component may be coupled to the coordinate frame baseplate may be commensurate with the slope at which the second bridging component may be coupled to the coordinate frame baseplate.

In certain embodiments, the predetermined height H may include a height that may be high enough with respect to the vehicle to achieve, for example, a sensor vertical FOV of areas surrounding the vehicle, as well as, for example, a 360° FOV of the environment surrounding the vehicle. At the same time, in certain embodiments, the predetermined height H may include a height that may be low enough to maintain, for example, an overall vehicle height that is less than an overhead clearance threshold H' (e.g., approximately 8.5-9 ft.). In this way, the autonomous or semi-autonomous vehicle may be allowed to safely proceed through, for example, residential garages, parking garages, tunnels, ferries, drive-thru restaurants, certain overpasses, hangars, car-carrying trailers, auto repair and maintenance shops, and so forth. Additionally, at the predetermined height H, the autonomous or semi-autonomous vehicle may be allowed to be subjected to additional testing scenarios (e.g., wind tunnel testing, thermal chamber testing, anechoic chamber testing, and so forth) that would otherwise be impracticable.

Furthermore, it should be appreciated that, in addition to the predetermined height design characteristics, the sloping design characteristics of the first bridging component and the second bridging component (e.g., sloping downwardly with respect to the coordinate frame baseplate) may also contribute to improved sensor FOV. Indeed, because the first bridging component and the second bridging component may slope downwardly with respect to the coordinate frame baseplate, any possibility that the respective transmit beams of the sensors may be occluded, for example, by either the first bridging component and the second bridging component and/or the rooftop of the vehicle may be eliminated and/or minimized. In another embodiment, the sloping design characteristics of the first bridging component and the second bridging component, in conjunction with the elevated design characteristics of the coordinate frame baseplate, may also improve the aerodynamics of the modular sensor assembly and/or the vehicle (e.g., by reducing aerodynamic drag and aerodynamic lift that may be associated with bulkier, distributed sensor setups). The elevated design characteristics of the coordinate frame baseplate may further provide additional cooling to the number of collocated sensors disposed thereon, as the elevated design characteristics may allow airflow to pass underneath the coordinate frame baseplate while, for example, the vehicle is in operation. In certain embodiments, the modular sensor assembly may be further designed according to a gross vehicle weight rating (GVWR) of the vehicle. For example, in one embodiment, the weight of the modular sensor assembly summed together with the weight of the vehicle may be less than the GVWR of the vehicle, with residual margin for adding a maximum passenger capacity. Thus, by providing a modular sensor assembly 104 designed according to the GVWR of the vehicle on which the modular sensor assembly is to be disposed, the overall safety and driving performance of the vehicle may be markedly improved and the passenger capacity of the vehicle may be maximized for improved utility.

Indeed, while the present techniques may be discussed henceforth primarily with respect to autonomous or semi-autonomous vehicle types such as minivans, caravans, multi-purpose vehicles (MPVs), sport utility vehicles (SUVs), crossover utility vehicles (CUVs), and recreational vehicles (RVs), it should be appreciated that the present techniques may be applied to any of various types of autonomous or semi-autonomous vehicles (e.g., cars, trucks, vans, buses, semi-trailer trucks, trains, trams, cable cars, tractors, forklifts, construction vehicles, farming vehicles, unmanned vehicles, drones, scooters, aircrafts, watercrafts, spacecrafts, and so forth). As used herein, "calibration" or "sensor calibration" may refer to a process utilized to inform an autonomous or semi-autonomous vehicle of the manner in which a number of sensors may be positioned on or about the vehicle, and to bring the information captured (e.g., raw sensor data) by each of the number of sensors into a common coordinate frame (e.g., a measurement reference frame). For example, in some embodiments, performing "calibration" or "sensor calibration" may include deploying one or more machine learning (ML) algorithms that may allow, for example, the autonomous or semi-autonomous vehicle to understand the manner in which the environment appears from the perspective of each individual sensor and/or each individual set of similar sensors. Similarly, as used herein, "data fusion" or "sensor data fusion" may refer to a sensor coverage, communication, reference, synchronization, and redundancy modality that may be established with respect to each individual sensor and/or each individual set of similar sensors disposed on an autonomous or semi-autonomous vehicle, such that the information captured (e.g., with respect to the vehicle itself and/or the environment in which the vehicle is operating) by each individual sensor or each individual set of similar sensors may be coalesced to generate increasingly accurate determinations (e.g., alerts, control actions) based thereon. For example, in some embodiments, performing "data fusion" or "sensor data fusion" may include deploying one or more deep learning algorithms to perform perception, mapping, localization, and control (e.g., based on the calibrated sensor data) of an autonomous or semi-autonomous vehicle.

Furthermore, as used herein, "modular" may refer to a system designated to include one or more subcomponents or subunits of standardized and purposeful size, design, construction, arrangement, positioning, configuration, disposition, calibration, universality, etc., such that the one or more subcomponents or subunits may be suitably arranged and/or fitted together onto a singular support medium in a myriad of ways and may each be interchangeable (e.g., swappable) with each other and/or with other similar subcomponents or subunits. For example, as used herein, a "modular" sensor assembly may include a sensor assembly including a coordinate frame baseplate, which may include one or more individually designated calibration locations for respective sensors or sets of sensors (e.g., sensors or sets of sensors of various modalities) and a retrofittable design, such that any of the sensors may be swapped onto the coordinate frame baseplate or swapped off from the coordinate frame baseplate without necessarily having to perform a recalibration (e.g., since all of the sensors are pre-calibrated to a common calibration point at least partially imparted by the coordinate frame baseplate). Further, additional sensors (e.g., of various modalities) that were not already part of the "modular" sensor assembly may also be added onto the coordinate frame baseplate without necessarily having to perform a recalibration.

In another embodiment, the coordinate frame baseplate of the "modular" sensor assembly may itself be interchangeable, such that the coordinate frame baseplate including only the sensors (i.e., apart from the complete structure of the "modular" sensor assembly or other structural components of the "modular" sensor assembly such as the first and second bridging components discussed previously) may be interchanged without any of the sensors necessarily having to be recalibrated (e.g., since all of the sensors are pre-calibrated to a common calibration point at least partially imparted by the coordinate frame baseplate), or without having to uninstall the complete structure of the "modular" sensor assembly from a vehicle, for example. Still, in another embodiment, the complete "modular" sensor assembly may itself be interchangeable, such that the complete "modular" sensor assembly may be swapped onto a vehicle or swapped off from a vehicle without any of the sensors necessarily having to be recalibrated. That is, the "modular" sensor assembly may include a universal sensor setup that may be calibrated either on a vehicle or calibrated apart from a vehicle. In this way, the "modular" sensor assembly, as provided herein, may vastly increase scalability and may be pre-calibrated apart from a vehicle and irrespective of the manufacturer and/or model of a vehicle onto which the "modular" sensor assembly is to be later disposed.

With the forgoing in mind, it may be useful to describe an example autonomous or semi-autonomous vehicle environment 100, as illustrated by FIG. 1. As depicted by FIG. 1, a vehicle 102 may include, for example, an autonomous or semi-autonomous vehicle such as a minivan, a caravan, a multi-purpose vehicle (MPV), a sport utility vehicle (SUV), a crossover utility vehicle (CUV), or a recreational vehicle (RV) that may be operated within the environment 100 (e.g. a real-world environment). As further depicted by FIG. 1, the vehicle 102 may include a modular sensor assembly 104, in accordance with the presently disclosed embodiments. In certain embodiments, the modular sensor assembly 104 may include a rooftop sensor setup that may be utilized, for example, to capture information about the vehicle 102 and/or environment 100 for performing perception (e.g., the resolving of certain agents that may be present within the environment 100 or vicinity of the vehicle 102 such as other vehicles, pedestrians, bicyclists, wildlife, vegetation, or any of various other potential moving and/or stationary obstructions), mapping (e.g., precise location information of the environment 100 such as road lanes, road lane boundaries, intersections, traffic lights, traffic signs, detours, road elevations, road declinations, railroad crossings, tramway tracks, speed bumps, and so forth), localization (e.g., the precise location of the vehicle 102 itself within the environment 100), and control (e.g., driving operations) of the vehicle 102. As depicted, in certain embodiments, the modular sensor assembly 104 may include a sleek and minimalistic design, such that the modular sensor assembly 104 may be positioned compactly on the rooftop of the vehicle 102 with only a minimal footprint. In other embodiments, as will be discussed in further detail below, the sleek and minimalistic design of the modular sensor assembly 104 may allow the modular sensor assembly 104 to achieve improved static and dynamic aerodynamic drag, static and dynamic aerodynamic lift, and weight distribution during, for example, operation of the vehicle 102.

Although not illustrated, it should be appreciated that, in addition to the modular sensor assembly 104 disposed onto the rooftop of the vehicle 102, in other embodiments, the vehicle 102 may also include additional sensors that may be disposed in other places of the vehicle 102. For example, in some embodiments, the vehicle 102 may include additional sensors that may be disposed, for example, along or underneath the front and back fenders of the vehicle 102, along the front grille of the vehicle 102, along a backside of the vehicle 102, along or underneath the side panels of the vehicle 102, along or underneath the chassis of the vehicle 102, inside a cockpit area of the vehicle 102, inside a payload area of the vehicle 102, within one or more wheel wells of the vehicle 102, and/or in various other places of the vehicle 102 that may be suitable for disposing sensors to collect information about the vehicle 102 and/or the environment 100.

Figure 2:
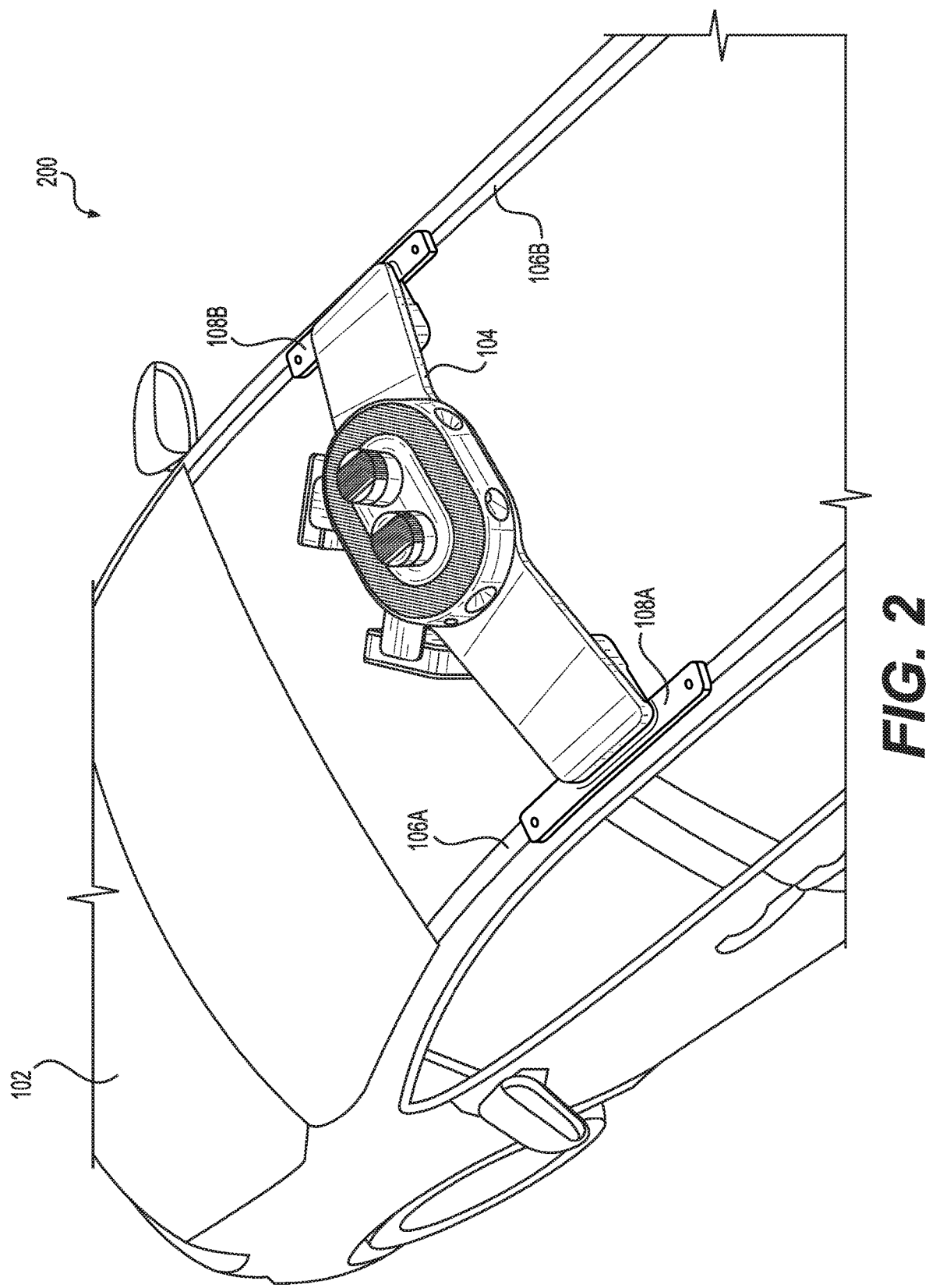
FIG. 2 illustrates a top perspective view of a modular sensor assembly disposed onto a rooftop of the vehicle.

FIG. 2 depicts a top perspective view 200 of the modular sensor assembly 104, illustrating the modular sensor assembly 104 as it may be disposed onto the rooftop of the vehicle 102, in accordance with the presently disclosed embodiments. In some embodiments, the modular sensor assembly 104 may be constructed together with the vehicle 102, for example, by an original equipment manufacturer (OEM) of the vehicle 102 and/or the modular sensor assembly 104. In other embodiments, the modular sensor assembly 104 may include a standalone sensor setup, which may be installed onto the rooftop of the vehicle 102 (e.g., an earlier model of the vehicle 102 or another vehicle 102 corresponding to a different manufacturer and model) as part of one or more retrofitting processes. For example, in some embodiments, the modular sensor assembly 104 may include a universal sensor setup that may be calibrated on the vehicle 102 or calibrated apart from the vehicle 102. Indeed, in accordance with the presently disclosed embodiments, the modular sensor assembly 104 may be suited for universalized sensor calibration and/or sensor data fusion, in which the sensor calibration and sensor data fusion may be performed, for example, independently of the vehicle 102. In this way, the modular sensor assembly 104 may be suitable for scaling production of the vehicle 102 and/or for occasionally retrofitting the vehicle 102, as the modular sensor assembly 104 may be updated, retrofitted, calibrated, and/or exchanged off or onto a particular vehicle 102 without significant disruption to the utility and operation of the vehicle 102.

As further illustrated by FIG. 2, in some embodiments, the modular sensor assembly modular sensor assembly 104 may be coupled to one or more rooftop rails 106A and 106B so that the modular sensor assembly 104 is elevated over the rooftop of the vehicle. For example, as will be described in further detail below with respect to FIG. 3, the modular sensor assembly 104 may include at least two oppositely extending bridging components that may respectively couple to the rooftop rails 106A and 106B. In some embodiments, the two oppositely extending bridging components may include one or more rail attachment pieces 108A and 108B that may be utilized, for example, to attach the modular sensor assembly 104 to the rooftop rails 106A and 106B via removable screws or bolts being attached through the rail attachment pieces 108A and 108B to the rooftop rails 106A and 106B. In other embodiments, the two oppositely extending bridging components may include one or more grooves, fasteners, latches, or other detachable mechanisms that may be utilized, for example, to detachably couple (e.g., removably secure) the modular sensor assembly 104 to the rooftop rails 106A and 106B.

Figure 3:
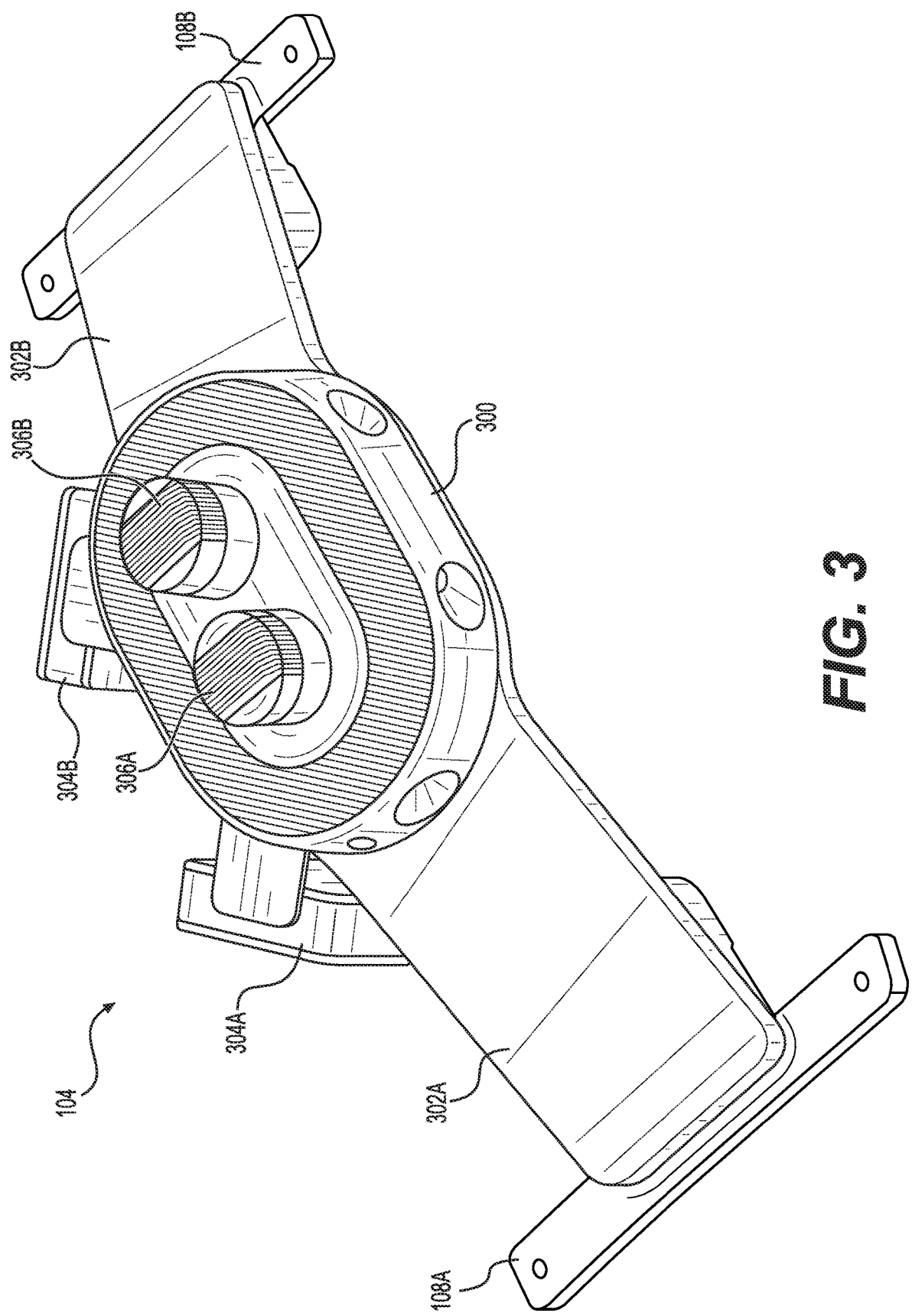
FIG. 3 illustrates a perspective view of a modular sensor assembly as a standalone device.

FIG. 3 illustrates a perspective view of a modular sensor assembly 104 illustrated as a standalone device, in accordance with the presently disclosed embodiments. As depicted by FIG. 3, in certain embodiments, the modular sensor assembly 104 may include a sensor enclosure 300, a first bridging component 302A, a second bridging component 302B, a first radar sensor 304A, a second radar sensor 304B, a first LiDAR sensor 306A, and a second LiDAR sensor 306B. In some embodiments, as will be further appreciated with respect to FIGS. 4A and 4B, the sensor enclosure 300 may include any weather-resistant enclosure that may be utilized to enclose a coordinate frame baseplate on which a number of two or more different types of sensors (e.g., LiDARs, cameras, IMUs, and so forth) may be secured to, and further to isolate (e.g., thermally, electrically, and/or electromagnetically isolate) the sensors (e.g., LiDARs, cameras, IMUs, and so forth) from the first radar sensor 304A and the second radar sensor 304B.

In certain embodiments, as further depicted by FIG. 3, the modular sensor assembly 104 may include the first radar sensor 304A and the second radar sensor 304B, which may each be disposed along a frontside (e.g., "forward-looking") of the modular sensor assembly 104 to monitor, for example, potential stationary and/or moving obstructions that may temporally materialize into a travel path of the vehicle 102. Specifically, the first radar sensor 304A and the second radar sensor 304B may each include a long-range radar (LRR), a medium-range radar (MRR), a short-range radar (SRR), some combination thereof, or other similar device that may be utilized to measure, for example, distance and radial velocity with respect to the vehicle 102 and one or more potential stationary and/or moving obstructions that may temporally materialize into a travel path of the vehicle 102.

As further illustrated by FIG. 3, the modular sensor assembly 104 may also include the first LiDAR sensor 306A and the second LiDAR sensor 306B. As depicted, the first LiDAR sensor 306A and the second LiDAR sensor 306B may each be partially housed, for example, by the sensor enclosure 300 to provide respective unobstructed, sweeping FOVs (e.g., 360°) of the environment 100 surrounding the vehicle 102 and/or of one or more areas alongside the vehicle 102. In some embodiments, the first LiDAR sensor 306A and the second LiDAR sensor 306B may operate in conjunction for purposes of redundancy, in which the first LiDAR sensor 306A and the second LiDAR sensor 306B may each have a perspective of the environment 100 for independently resolving the same agents that may be present within the environment 100 and/or within the vicinity of the vehicle 102 such as other vehicles, pedestrians, bicyclists, wildlife, vegetation, or any of various other potential moving and/or stationary obstructions that may temporally materialize into the travel path of the vehicle 102.

Figure 4C:
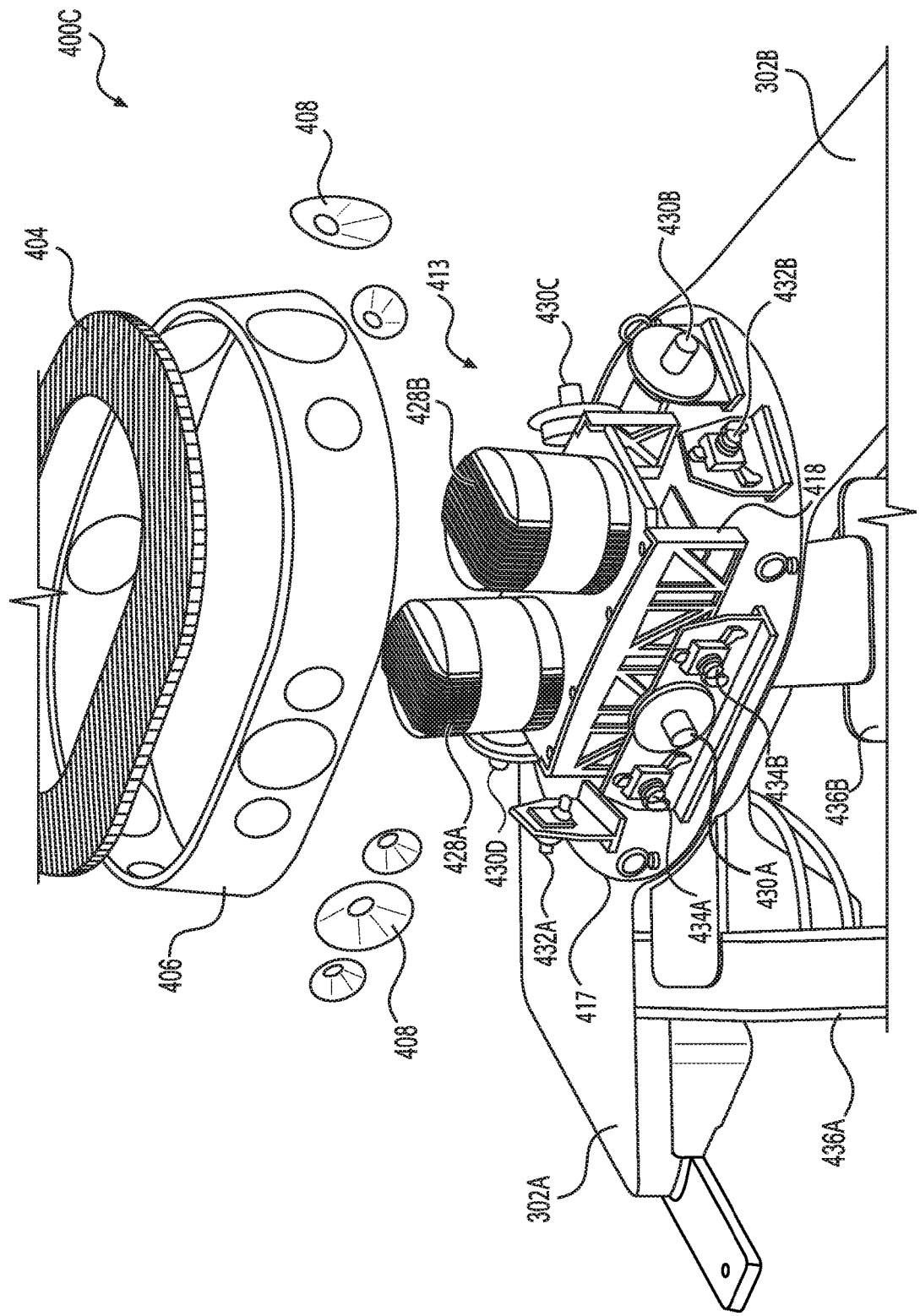
FIG. 4C illustrates an exploded view of one or more electronic components of a modular sensor assembly.

Turning now to FIG. 4A, an exploded view of a modular sensor assembly 400A is illustrated. Specifically, as depicted, the exploded view of the modular sensor assembly modular sensor assembly 400A may provide detailed illustrations of each of the mechanical components of the modular sensor assembly 400A, in accordance with the presently disclosed embodiments. Similarly, FIG. 4B illustrates an exploded view of a radar housing 400B of the modular sensor assembly 400A. FIG. 4C illustrates an exploded view of a modular sensor assembly 400C, including detailed illustrations of each of the electronic components of the modular sensor assembly 400C, in accordance with the presently disclosed embodiments. For example, as depicted by FIG. 4A, the mechanical components of the modular sensor assembly 400A may generally include a LiDAR sensor bezel 402, a top cover 404, a main bezel 406, camera bezels 408, a first bridging component cover 410A, a second bridging component 410B, a coordinate frame baseplate 412, a first bridging component 414A, a second bridging component 414B, a first radar bracket 416A, and a second radar bracket 416B. Similarly, as depicted by FIG. 4B, a radar bracket housing top 422, a radar bracket housing bottom 423, a radar main component 424, a radar cover component 425, and an egress tool component 426 are illustrated. As depicted by FIG. 4C, the electronic components of the modular sensor assembly 400C may generally include a first LiDAR sensor 428A, a second LiDAR sensor 428B, a number of wide cameras 430A, 430B, 430C, and 430D, a first narrow camera 432A, a second narrow camera 432B, a first traffic camera 434A, a second traffic camera 434B, a first radar 436A, and a second radar 436B.

Referring first to FIG. 4A, in certain embodiments, the LiDAR sensor bezel 402 may include a metal bracing ring (e.g., aluminum, aluminum alloy, anodized aluminum) that partially encloses the LiDAR sensors 428A and 428B and may be utilized to prevent the LiDAR sensors 428A and 428B, for example, from shifting during operation of the vehicle 102. In another embodiment, the LiDAR sensor bezel 402 may also provide isolation (e.g., thermal isolation, electrical isolation, and/or crosstalk isolation) between the first LiDAR sensor 428A and the second LiDAR sensor 428B. The top cover 404 may include a metal ring (e.g., aluminum, aluminum alloy, anodized aluminum) that may be utilized to further secure the LiDAR sensors 428A and 428B in place on the coordinate frame baseplate 412. The main bezel 406 and the camera bezels 408 may include metal bezels (e.g., anodized aluminum) that may be utilized to hold in place, for example, the number of wide cameras 430A, 430B, 430C, and 430D, the first narrow camera 432A, the second narrow camera 432B, the first traffic camera 434A, and the second traffic camera 434B on the coordinate frame baseplate 412.

In one embodiment, the main bezel 406 and the camera bezels 408 may provide isolation (e.g., thermal isolation and/or electrical isolation) between the number of wide cameras 430A, 430B, 430C, and 430D, the first narrow camera 432A, the second narrow camera 432B, the first traffic camera 434A, and the second traffic camera 434B. As depicted, the main bezel 406 may include circular cutout portions specifically sized and fitted precisely to, for example, the respective sizes of the camera bezels 408 and the focusing rings of the number of wide cameras 430A, 430B, 430C, and 430D, the first narrow camera 432A, the second narrow camera 432B, the first traffic camera 434A, and the second traffic camera 434B. Thus, the main bezel 406 and the camera bezels 408 may prevent the number of wide cameras 430A, 430B, 430C, and 430D, the first narrow camera 432A, the second narrow camera 432B, the first traffic camera 434A, and the second traffic camera 434B from jolting or detaching while, for example, the vehicle 102 is operation. In another embodiment, the main bezel 406 and the camera bezels 408 may further provide crosstalk isolation between the number of wide cameras 430A, 430B, 430C, and 430D, the first narrow camera 432A, the second narrow camera 432B, the first traffic camera 434A, and the second traffic camera 434B.

In certain embodiments, as further depicted by the modular sensor assembly 400A of FIG. 4A, the modular sensor assembly 400A may include the first bridging component cover 410A and the second bridging component cover 410B. The first bridging component cover 410A and the second bridging component cover 410B may be utilized to protect the first bridging component 414A and the second bridging component 414B, respectively. For example, in some embodiments, the first bridging component cover 410A and the second bridging component 410B may each include, for example, a polymer plastic, a ceramic, a fiberglass, or other resistant or semi-resistant material that may overlay and encapsulate the first bridging component 414A and the second bridging component 414B, protecting the first bridging component 414A and the second bridging component 414B from weather and/or other environmental and atmospheric conditions. In other embodiments, the first bridging component cover 410A and the second bridging cover 410B may be included to provide an improved aesthetic with respect to the first bridging component 414A and the second bridging component 414B, respectively.

In certain embodiments, as further illustrated by FIG. 4A, the first bridging component 414A and the second bridging component 414B may each be suitable for detachably coupling (e.g., on a first end of the respective first bridging component 414A and second bridging component 414A) to respective rails 106A and 106B atop the vehicle 102 (e.g., on the rooftop of the vehicle 102) as generally discussed above with respect to FIGS. 2 and 3. As such, as further depicted, the first bridging component 414A may include a first flange end 415A and the second bridging component 414B may include a second flange end 415B. The first flange end 415A and the second flange end 415B may each include, for example, one or more bolting holes or screwing holes for detachably coupling to the rail attachment pieces 108A and 108B, and, by extension, to the respective rails 106A and 106B atop the vehicle 102.

In some embodiments, the first bridging component 414A and the second bridging component 414B may each be coupled (e.g., on a second opposing end of the respective first bridging component 414A and the second bridging component 414B) to the coordinate frame baseplate 412. For example, in one embodiment, the first bridging component 414A and the second bridging component 414B may each be detachably coupled to the coordinate frame baseplate 412, such that the coordinate frame baseplate 412 may be detachably removed from the vehicle 102 and/or interchanged onto or off from the vehicle 102 without having to remove, for example, the first bridging component 414A and the second bridging component 414B. Particularly, as further depicted, the first bridging component 414A and the second bridging component 414B may each be coupled to respective perimeter portions of the coordinate frame baseplate 412 at a particular slope (e.g., approximately 15°, approximately 30°, approximately 45°, approximately 60°, approximately 75°, or other similar acute angle), such that the coordinate frame baseplate 412 may be elevated to a predetermined physical height H (e.g., a height of less than or equal to approximately 8 ft., a height of less than or equal to approximately 7.5 ft., a height of less than or equal to approximately 7 ft., a height of less than or equal to approximately 6.5 ft., a height of less than or equal to approximately 6 ft., and so on and so forth) with respect to the vehicle 102. In one embodiment, the slope at which the first bridging component 414A may be coupled to the coordinate frame baseplate 412 may be commensurate with the slope at which the second bridging component 414B may be coupled to the coordinate frame baseplate 412.

For example, in certain embodiments, the predetermined height H may include a height that may be high enough with respect to the vehicle 102 to achieve, for example, a sensor vertical FOV of areas surrounding the vehicle 102, as well as a 360° FOV of the environment 100. At the same time, the predetermined height H may include a height that may be low enough to maintain, for example, an overall vehicle 102 height that is less than an overhead clearance threshold H' (e.g., approximately 8.5-9 ft.). In this way, the vehicle 102 may be allowed to safely proceed through, for example, residential garages, parking garages, tunnels, ferries, drive-thru restaurants, certain overpasses, hangars, car-carrying trailers, auto repair and maintenance shops, and so forth. Additionally, at the predetermined height H imparts the vehicle 102 with additional flexibility to undergo additional testing scenarios (e.g., wind tunnel testing, thermal chamber testing, anechoic chamber testing, and so forth) that would otherwise be impracticable.

In certain embodiments, in addition to the predetermined height design characteristics of the coordinate frame baseplate 412, the sloping design characteristics of the first bridging component 414A and the second bridging component 414B (e.g., sloping downwardly with respect to the coordinate frame baseplate 412) may also contribute to improved sensor FOV. For example, because the first bridging component 414A and the second bridging component 414B may slope downwardly with respect to the coordinate frame baseplate 412, any possibility that the respective transmit beams of the number collocated sensors 413 may be occluded, for example, by either the first bridging component 414A and the second bridging component 414B and/or the rooftop of the vehicle 102 may be further reduced. In another embodiment, the sloping design characteristics of the first bridging component 414A and the second bridging component 414B, in conjunction with the elevated design characteristics of the coordinate frame baseplate 412, may also improve the aerodynamics of the modular sensor assembly 400A and/or the vehicle 102 (e.g., by reducing aerodynamic drag and aerodynamic lift). The elevated design characteristics of the coordinate frame baseplate 412 may further provide additional cooling to the number of collocated sensors 413 disposed thereon, as the elevated design characteristics may allow airflow to pass underneath the coordinate frame baseplate 412 while, for example, the vehicle 102 is in operation.

In certain embodiments, the coordinate frame baseplate 412 may include a number of collocated sensors 413, which may be disposed thereon. For example, in one embodiment, the coordinate frame baseplate 412 may include, for example, a stiffened and flat metal (e.g., aluminum, aluminum alloy, anodized aluminum, copper, copper-clad invar, and so forth) baseplate that may be utilized as a support structure for the number of collocated sensors 413 and to impart a common coordinate frame (e.g., a measurement reference frame) for the number of collocated sensors 413. In certain embodiments, the coordinate frame baseplate 412 may impart a common coordinate frame (e.g., a measurement reference frame) by which a sensor calibration and sensor data fusion may be performed based thereon. Specifically, in some embodiments, the coordinate frame baseplate 412 may impart a common coordinate frame (e.g., a singular measurement reference frame) by which a sensor calibration and/or sensor data fusion of the number of collocated sensors 413 may be performed based thereon and independently from a vehicle 102.

As further depicted, the coordinate frame baseplate 412 may include a circular or elliptical body portion, which may include, for example, a continuous surface 417 (e.g., stiffened and flat surface) and a platform surface 418 (e.g., elevated surface) that may be coupled to the body portion and overlaying (e.g., overtopping) the continuous surface 417. In some embodiments, the continuous surface 417 may include sufficient space to closely collocate up to, for example, 12-15 individual sensors depending on the particular application. However, while the coordinate frame baseplate 412 may include sufficient space to accommodate the number of collocated sensors 413, it should be appreciated that the coordinate frame baseplate 412 may nevertheless include a relatively small footprint (e.g., approximately 10-18 inches in diameter) to control, for example, the flatness, stability (e.g., static stability and dynamic stability), aerodynamic drag, aerodynamic lift, vibration, and weight distribution of the coordinate frame baseplate 412.

In some embodiments, the individual locations for placing each of the number of collocated sensors 413 may be specifically designated based on one or more structural analyses and sensor FOV optimization analyses performed, for example, during manufacturing and/or calibration. Indeed, because the coordinate frame baseplate 412 may include one or more individually designated calibration locations, the coordinate frame baseplate 412 may include a modular and retrofittable design, such that any of the number of collocated sensors 413 may be interchanged without necessarily having to perform a recalibration. As further illustrated, in some embodiments, the continuous surface 417 may include a cutout region 419 over which the platform surface 418 may be constructed. In one embodiment, the cutout region 419 may include a space sufficient to direct, for example, one or more power cables and/or communication cables to the first LiDAR sensor 428A and the second LiDAR sensor 428B that may be disposed onto the platform surface 418.

In some embodiments, as further illustrated by the modular sensor assembly 400A, the continuous surface 417 (e.g., stiffened and flat surface) may include a number of mounting attachment pieces 420A, 420B, and 420C disposed along the periphery of the continuous surface 417, such that the number of mounting attachment pieces 420A, 420B, and 420C may surround the platform surface 418 and the cutout region 419. In certain embodiments, the number of mounting attachment pieces 420A, 420B, and 420C may each include a metal bracketing component for detachably mounting (e.g., for facilitating interchangeability) the number of wide cameras 430A, 430B, 430C, and 430D, the first narrow camera 432A, the second narrow camera 432B, the first traffic camera 434A, and the second traffic camera 434B to the continuous surface 417 and at a particular first height.

For example, in one embodiment, the number of mounting attachment pieces 420A, 420B, and 420C may position the number of wide cameras 430A, 430B, 430C, and 430D, the first narrow camera 432A, the second narrow camera 432B, the first traffic camera 434A, and the second traffic camera 434B at a height of approximately 2-3 inches above the continuous surface 417. Indeed, by providing the number of mounting attachment pieces 420A, 420B, and 420C for positioning the number of wide cameras 430A, 430B, 430C, and 430D, the first narrow camera 432A, the second narrow camera 432B, the first traffic camera 434A, and the second traffic camera 434B at a first particular height (e.g., approximately 2-4 inches above the continuous surface 417) and along the periphery of the continuous surface 417, the sight coverage (e.g., FOV) for the aforementioned cameras may be maximized. Specifically, such positioning may minimize the possibility that the view of the cameras 430A, 430B, 430C, and 430D, 432A, 432B, 434A, and 434B may be occluded by any component of the modular sensor assembly 400A itself and/or the vehicle 102. Additionally, as will be further appreciated with respect to FIGS. 5 and 6, such positioning of the number of wide cameras 430A, 430B, 430C, and 430D, the first narrow camera 432A, the second narrow camera 432B, the first traffic camera 434A, and the second traffic camera 434B may further preclude any interference and/or undesirable overlap between the sight coverages of the cameras 430A, 430B, 430C, 430D, 432A, 432B, 434A, and 434B and the sensor coverages of the first LiDAR sensor 428A and the second LiDAR sensor 428B.

As further depicted, the modular sensor assembly 400A may also include hooking elements 421A and 421B, which may each include a metal ring that may be coupled to the coordinate frame baseplate 412. In some embodiments, the hooking elements 421A and 421B may be provided to facilitate the removal (e.g., either manually or via towing or lifting device) of the coordinate frame baseplate 412 itself (including the number of sensors 413), the coordinate frame baseplate 412 (including the number of sensors 413) together with only the first bridging component 414A and the second bridging component 414B, and/or the entire modular sensor assembly 400A from the vehicle 102, for example.

In certain embodiments, as further illustrated by the modular sensor assembly 400A, the platform surface 418 (e.g., elevated surface) may be utilized to mount the first LiDAR sensor 428A and the second LiDAR sensor 428B at a second particular height with respect to the continuous surface 417 (e.g., stiffened and flat surface) for maximizing sensor coverage (e.g., FOV) and precluding occlusion of the sensor coverage (e.g., FOV) for the first LiDAR sensor 428A and the second LiDAR sensor 428B. For example, in one embodiment, the platform surface 418 (e.g., elevated surface) may mount the first LiDAR sensor 428A and the second LiDAR sensor 428B at a height of approximately 3-6 inches above the number of mounting attachment pieces 420A, 420B, and 420C including the cameras 430A, 430B, 430C, 430D, 432A, 432B, 434A, and 434B. In this way, by providing the platform surface 418 (e.g., elevated surface) for mounting the first LiDAR sensor 428A and the second LiDAR sensor 428B at a second particular height (e.g., approximately 3-6 inches above the number of mounting attachment pieces 420A, 420B, and 420C), the sensor coverage (e.g., FOV) for the first LiDAR sensor 428A and the second LiDAR sensor 428B may be maximized. Furthermore, as will be further appreciated with respect to FIGS. 5 and 6, by providing the platform surface 418 (e.g., elevated surface) for mounting the first LiDAR sensor 428A and the second LiDAR sensor 428B at the second particular height (e.g., approximately 3-6 inches above the number of mounting attachment pieces 420A, 420B, and 420C), any interference and/or undesirable overlap between the sensor coverages (e.g., FOV) of the first LiDAR sensor 428A and the second LiDAR sensor 428B and the sight coverages (e.g., FOV) of the cameras 430A, 430B, 430C, 430D, 432A, 432B, 434A, and 434B may be precluded.

In certain embodiments, as further depicted by FIG. 4A, the modular sensor assembly 400A may also include the first radar bracket 416A, the second radar bracket 416B, the radar bracket housing top 422, the radar bracket housing bottom 423, the radar main component 424, the radar cover component 425, and the egress tool component 426. The first radar bracket 416A and the second radar bracket 416B may include a metal (e.g., aluminum, aluminum alloy, anodized aluminum) attachment component that may be utilized, for example, to respectively secure the first radar 436A and the second radar 436B to the coordinate frame baseplate 412. In some embodiments, the first radar bracket 416A may be mounted at a first end to a perimeter of the body portion of the coordinate frame baseplate 412, such that the first radar bracket 416A may project outwardly (e.g., in the z-direction), for example, from the perimeter of the body of the coordinate frame baseplate 412 to position the first radar 436A (e.g., secured to the a second end of the first bracket 416A) in a "forward-looking" position and at a third particular height.

Similarly, the second radar bracket 416B may be mounted at a first end to another portion of the perimeter of the body portion of the coordinate frame baseplate 412, such that the second radar bracket 416B may project outwardly (e.g., in the z-direction), for example, from the perimeter of the body of the coordinate frame baseplate 412 to position the second radar 436B (e.g., secured to a second end of the second bracket 416B) in a "forward-looking" position and at the third particular height. For example, in one embodiment, the first radar bracket 416A and the second radar bracket 416B may mount the first radar 436A and the second radar 436B at the height of approximately 3-5 inches below the number of mounting attachment pieces 420A, 420B, and 420C including the cameras 430A, 430B, 430C, 430D, 432A, 432B, 434A, and 434B to preclude possible occlusion and/or interference with the sight coverage (e.g., FOV) of the cameras 430A, 430B, 430C, 430D, 432A, 432B, 434A, and 434B and/or the sensor coverage (e.g., FOV) of the first LiDAR sensor 428A and the second LiDAR sensor 428B.

In certain embodiments, the radar housing 400B may include the radar bracket housing top 422, the radar bracket housing bottom 423, the radar main component 424, the radar cover component 425, and the egress tool component 426 may be collectively utilized, for example, to cover and protect the first radar 436A and the second radar 436B. In some embodiments, the radar bracket housing top 422, the radar bracket housing bottom 423, the radar main component 424, the radar cover component 425, and the egress tool component 426 may each include, for example, a resistant or semi-resistant material that may be provided to protect the first radar 436A and the second radar 436B from weather and/or other environmental and atmospheric conditions.

In certain embodiments, as previously discussed above, the coordinate frame baseplate 412 may be provided to impart a common coordinate frame for calibration of the number of wide cameras 430A, 430B, 430C, and 430D, the first narrow camera 432A, the second narrow camera 432B, the first traffic camera 434A, and the second traffic camera 434B, the first LiDAR sensor 428A and the second LiDAR sensor 428B, and the first radar 436A and the second radar 436B. For example, in some embodiments, prior to disposing the coordinate frame baseplate 412 onto, for example, the rooftop of the vehicle 102 (e.g., independently of the vehicle 102). For example, in some embodiments, prior to disposing the modular sensor assembly 400A onto a rooftop of vehicle 102, the cameras 430A, 430B, 430C, 430D, 432A, 432B, 434A, and 434B disposed onto the continuous surface 417 (e.g., stiffened and flat surface) at the first particular height (e.g., approximately 2-4 inches above the continuous surface 417) may be calibrated to a target calibration position corresponding to the common coordinate frame (e.g., a measurement reference frame) as imparted by the coordinate frame baseplate 412.

Similarly, the first LiDAR sensor 428A and the second LiDAR sensor 428B disposed onto the platform surface 418 (e.g., elevated surface) at the second particular height (e.g., approximately 3-6 inches above the number of mounting attachment pieces 420A, 420B, and 420C) may be calibrated to the target calibration position corresponding to the common coordinate frame as imparted by the coordinate frame baseplate 412. Likewise, the first radar 436A and the second radar 436B coupled to the perimeter of the coordinate frame baseplate 412 at the third particular height (e.g., approximately 3-5 inches below the number of mounting attachment pieces 420A, 420B, and 420C including the cameras 430A, 430B, 430C, 430D, 432A, 432B, 434A, and 434B) may be calibrated to the target calibration position corresponding to the common coordinate frame as imparted by the coordinate frame baseplate 412.

Referring now to FIG. 4C, as previously noted, the modular sensor assembly 400C may generally include the first LiDAR sensor 428A, the second LiDAR sensor 428B, the number of wide cameras 430A, 430B, 430C, and 430D, the first narrow camera 432A, the second narrow camera 432B, the first traffic camera 434A, the second traffic camera 434B, the first radar 436A, and the second radar 436B. In some embodiments, as further illustrated FIG. 4C, the number of collocated sensors 413 that may be disposed onto the coordinate frame baseplate 412 may include the first LiDAR sensor 428A, the second LiDAR sensor 428B, the number of wide cameras 430A, 430B, 430C, and 430D, the first narrow camera 432A, the second narrow camera 432B, the first traffic camera 434A, and the second traffic camera 434B. However, it should be appreciated that the number of collocated sensors 413 (as depicted by FIG. 4C) may represent merely one embodiment of the number of collocated sensors 413 that may be disposed onto the coordinate frame baseplate 412. For example, in other embodiments, the number of collocated sensors 413 disposed onto the coordinate frame baseplate 412 may include any applicable combination of sensors (e.g., temperature sensors, pressure sensors, speed sensors, acceleration sensors, fuel sensors, level sensors, flow sensors, optical sensors, torque sensors, motion sensors, vapor sensors, humidity sensors, stress sensors, strain sensors, load sensors, orientation sensors, altitude sensors, displacement sensors, position sensors, condensation sensors, and so forth), image-capturing devices (e.g., cameras, scanners, ultrasonic imaging devices, thermal imaging devices, electromagnetic imaging devices, and so forth), and/or any of various other devices that may detect data or receive data (e.g., over a network) regarding the vehicle 102 and/or the environment 100.

In certain embodiments, as generally noted above with respect to FIG. 3, the first LiDAR sensor 428A and the second LiDAR sensor 428B may each include, for example, any device that may be utilized to provide an unobstructed, sweeping FOV (e.g., 360°) of the environment 100 surrounding the vehicle 102 and/or of one or more areas surrounding the vehicle 102. In some embodiments, as further depicted by FIG. 4C, the first LiDAR sensor 428A and the second LiDAR sensor 428B may each be disposed at an elevated position (e.g., at the center of the coordinate frame baseplate 412) with respect to, for example, the number of wide cameras 430A, 430B, 430C, and 430D, the first narrow camera 432A, the second narrow camera 432B, the first traffic camera 434A, and the second traffic camera 434B. For example, in one embodiment, the first LiDAR sensor 428A and the second LiDAR sensor 428B may each be disposed at an elevated position to ensure that the first LiDAR sensor 428A and the second LiDAR sensor 428B maintain an unobstructed FOV (e.g., 360°) of the environment 100, further reducing any possibility that the respective transmit beams of first LiDAR sensor 428A and the second LiDAR sensor 428B may be occluded, for example, by either the first bridging component 414A and the second bridging component 414B and/or the rooftop of the vehicle 102.

As further depicted by FIG. 4C, in certain embodiments, the number of wide cameras 430A, 430B, 430C, and 430D, the first narrow camera 432A, the second narrow camera 432B, the first traffic camera 434A, and the second traffic camera 434B may each be disposed, for example, in an alternating sequence along the periphery of the coordinate frame baseplate 412. In one embodiment, the position in which the number or wide cameras 430A, 430B, 430C, and 430D, the first narrow camera 432A, the second narrow camera 432B, the first traffic camera 434A, and the second traffic camera 434B may be placed along the periphery of the coordinate frame baseplate 412 may be based on their respective FOVs. For example, in some embodiments, the number of wide cameras 430A, 430B, 430C, and 430D may each include a wide-angle FOV or an ultra-wide angle FOV camera (e.g., fisheye cameras, rectilinear cameras). Specifically, the number of wide cameras 430A, 430B, 430C, and 430D may be provided to capture the widest possible view of the environment 100 per image frame, for example, without regard to any specific object of the environment 100. For example, in one embodiment, the number of wide cameras 430A, 430B, 430C, and 430D may include a FOV of approximately 110°. However, because the entire 110° FOV may not be suitable for every application, in some embodiments, processing power, storage, and data throughput may be improved by utilizing only a subset (e.g., approximately 80°-85°) of the 110° FOV of the respective wide cameras 430A, 430B, 430C, and 430D.

In some embodiments, as further depicted by FIG. 4C, the number of wide cameras 430A, 430B, 430C, and 430D may be disposed along the periphery of the coordinate frame baseplate 412 to face, for example, each of the four cardinal directions, respectively (e.g., wide camera 430A disposed to face northward, wide camera 430B disposed to face westward, wide camera 430C disposed to face southward, and wide camera 430D disposed to face eastward). In other embodiments, the number of wide cameras 430A, 430B, 430C, and 430D may be disposed along the periphery of the coordinate frame baseplate 412 to face, for example, each of the four intermediate directions, respectively (e.g., wide camera 430A disposed to face northeastward, wide camera 430B disposed to face northwestward, wide camera 430C disposed to face southeastward, and wide camera 430D disposed to face southwestward). In this way, the number of wide cameras 430A, 430B, 430C, and 430D may capture, for example, the widest possible view of the environment 100 per image frame.

In certain embodiments, the first narrow camera 432A, the second narrow camera 432B, the first traffic camera 434A, and the second traffic camera 434B may each include, for example, a narrow-angle FOV camera (e.g., telephoto cameras). Thus, in certain embodiments, as further depicted by FIG. 4C, the first narrow camera 432A, the second narrow camera 432B, the first traffic camera 434A, and the second traffic camera 434B may each be disposed much closer to each other and to face any of various directions along the periphery of the coordinate frame baseplate 412. Specifically, the first narrow camera 432A, the second narrow camera 432B, the first traffic camera 434A, and the second traffic camera 434B may each be provided to capture, for example, specific objects (e.g., traffic, traffic lights, traffic signals) and/or aspects of the environment 100 with the highest possible precision and resolution per image frame.

In certain embodiments, as further depicted by the FIG. 4C, the modular sensor assembly 400C may include the first radar sensor 436A and the second radar sensor 438B. In some embodiments, the first radar sensor 436A and the second radar sensor 438B may each be disposed along a frontside (e.g., "forward-looking") of the coordinate frame baseplate 412 and/or the modular sensor assembly 400C to monitor, for example, potential stationary and/or moving obstructions that may temporally materialize into a travel path of the vehicle 102. For example, in one embodiment, the first radar sensor 436A and the second radar sensor 436B may each include an LRR, an MRR, an SRR, or other similar device that may be utilized to measure, for example, distance and radial velocity with respect to the vehicle 102 and one or more potential stationary and/or moving obstructions that may temporally materialize into a travel path of the vehicle 102.

Figure 5:
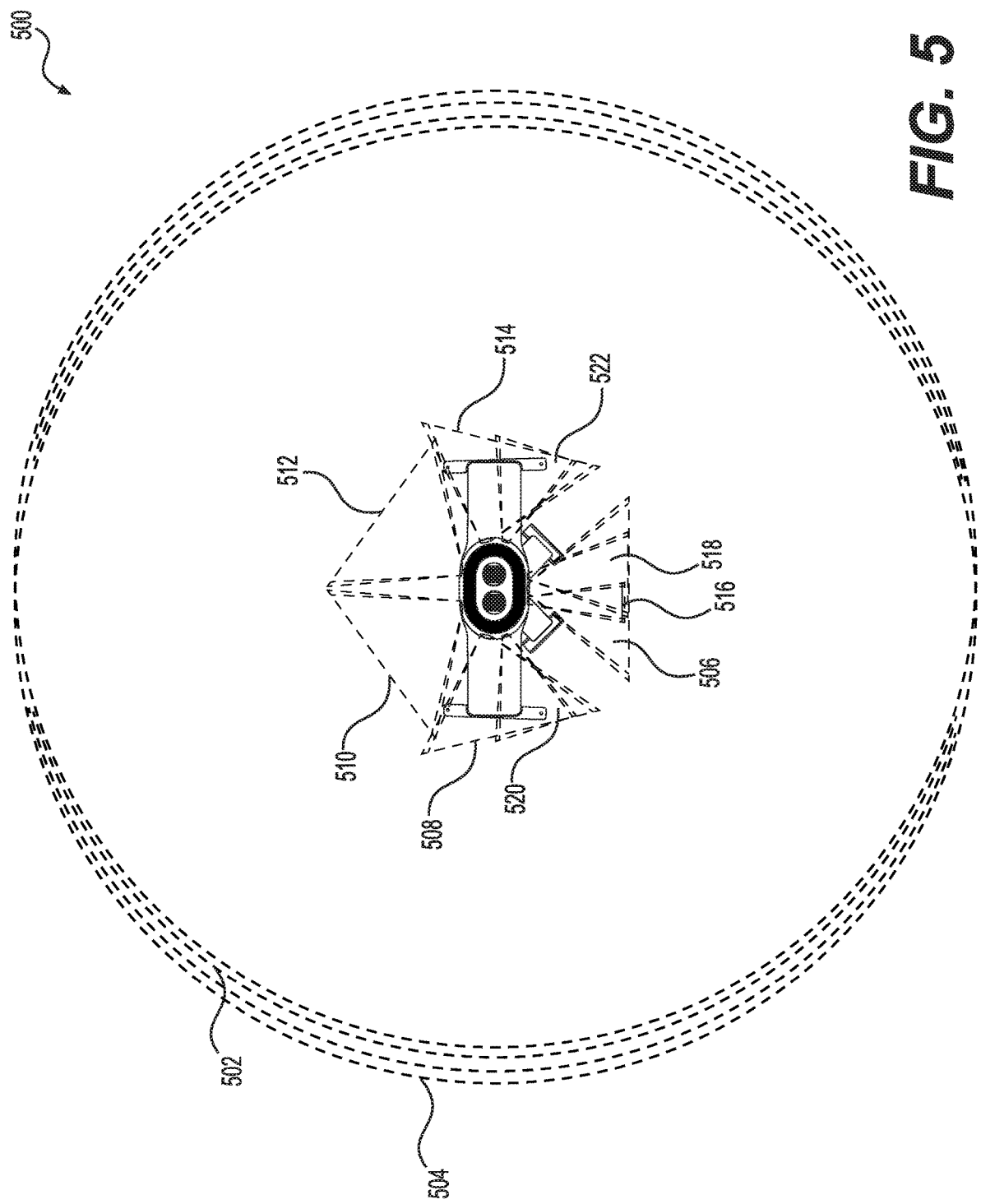
FIG. 5 illustrates an embodiment of one or more sensor coverages of a modular sensor assembly.
Figure 6:
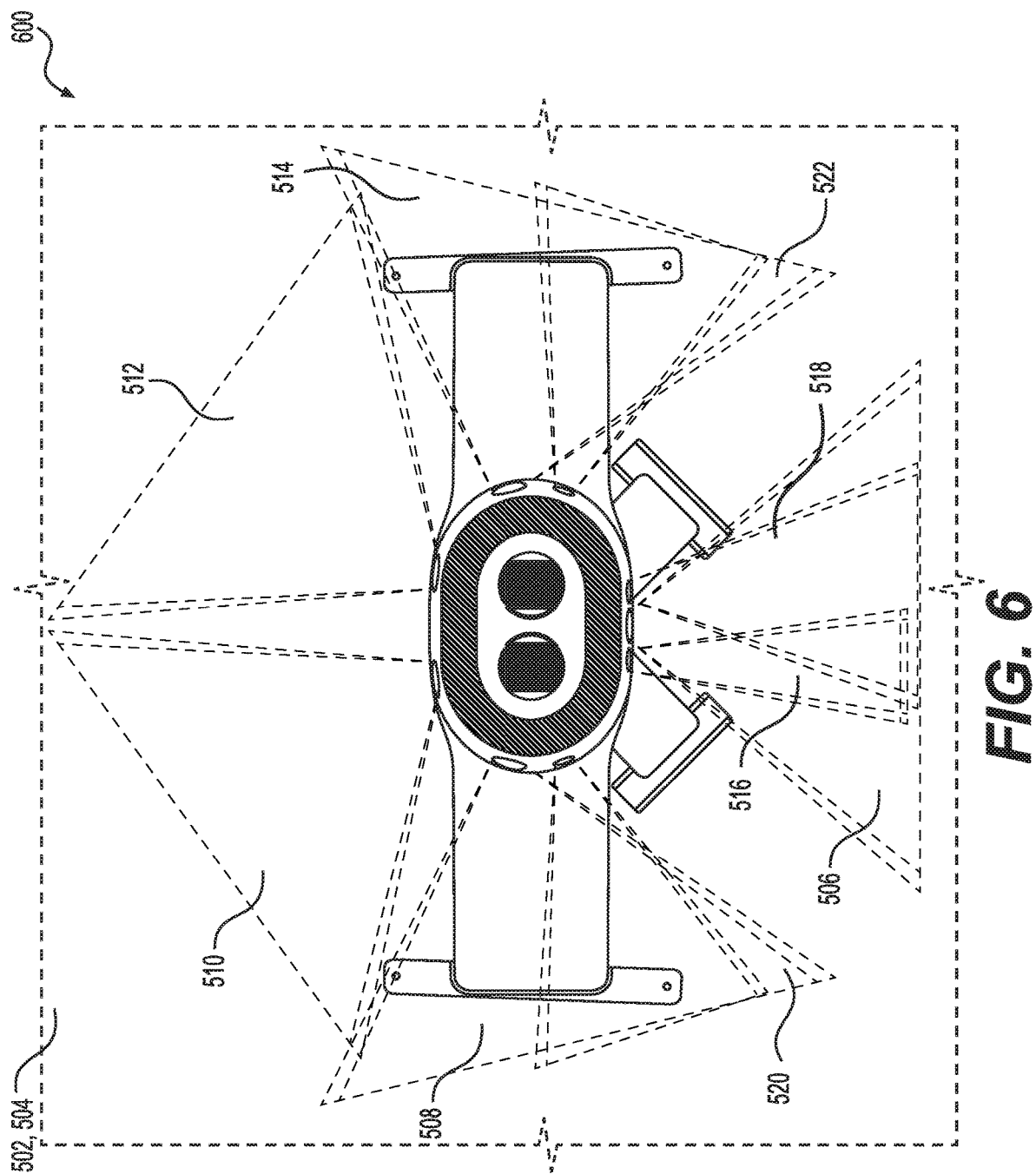
FIG. 6 illustrates another embodiment of one or more sensor coverages of a modular sensor assembly.

FIG. 5 and FIG. 6 illustrate respective aerial-view diagrams 500 and 600 of embodiments of the sensor coverages of the first LiDAR sensor 428A and the second LiDAR sensor 428B and the sight coverages of the cameras 430A, 430B, 430C, 430D, 432A, 432B, 434A, and 434B. As depicted, the sensor coverage 502 corresponding to the first LiDAR sensor 428A may include an unobstructed, sweeping 360° FOV of, for example, the environment 100 surrounding the vehicle 102. Similarly, the sensor coverage 504 corresponding to the second LiDAR sensor 428B may include a second unobstructed, sweeping 360° FOV of the environment 100 surrounding the vehicle 102, for example. In certain embodiments, the first LiDAR sensor 306A and the second LiDAR sensor 306B may operate in conjunction for purposes of redundancy, and thus the sensor coverage 502 and the sensor coverage 504 may, in some embodiments, include identical and/or nearly identical views of the environment 100 surrounding the vehicle 102, for example.

As further depicted, the sight coverages 506, 508, 510, 512, and 514 may correspond to the number of wide cameras 430A, 430B, 430C, and 430D, and thus may be suitable for capturing, for example, the widest possible view of the environment 100 per image frame. On the other hand, the sight coverages 516 and 518 may respectively correspond the first traffic camera 434A and the second traffic camera 434B, and may thus capture, for example, only specific objects (e.g., traffic, traffic lights, traffic signals). In one embodiment, for the purposes of redundancy and precision, the sight coverages 516 and 518 may include at least some overlap with the sight coverage 506 (e.g., wide FOV), as illustrated.

Similarly, the sight coverages 520 and 522 may respectively correspond to the first narrow camera 432A and the second narrow camera 432B, and thus may be suitable for capturing, for example, specific objects and/or aspects of the environment 100 with the highest possible precision and resolution per image frame. In one embodiment, for the purposes of redundancy and precision, the sight coverages 520 and 522 may include at least some overlap with the sight coverages 508 and 514 (e.g., wide FOV), respectively. It should be appreciated that while one or more of the sight coverages 506-522 may include at least some overlap with each other, none of the sight coverages 506-522 may overlap and/or interfere with the sensor coverages 502 and 504. For example, as previously discussed above with respect to FIGS. 4A and 4B, because the first LiDAR sensor 428A and the second LiDAR sensor 428B may be disposed at a height higher than that of the cameras 430A, 430B, 430C, 430D, 432A, 432B, 434A, and 434B, any possible occlusion and/or interferences between the sensor coverages 502 and 504 and the sight coverages 506-522 may be precluded.

Figure 7:
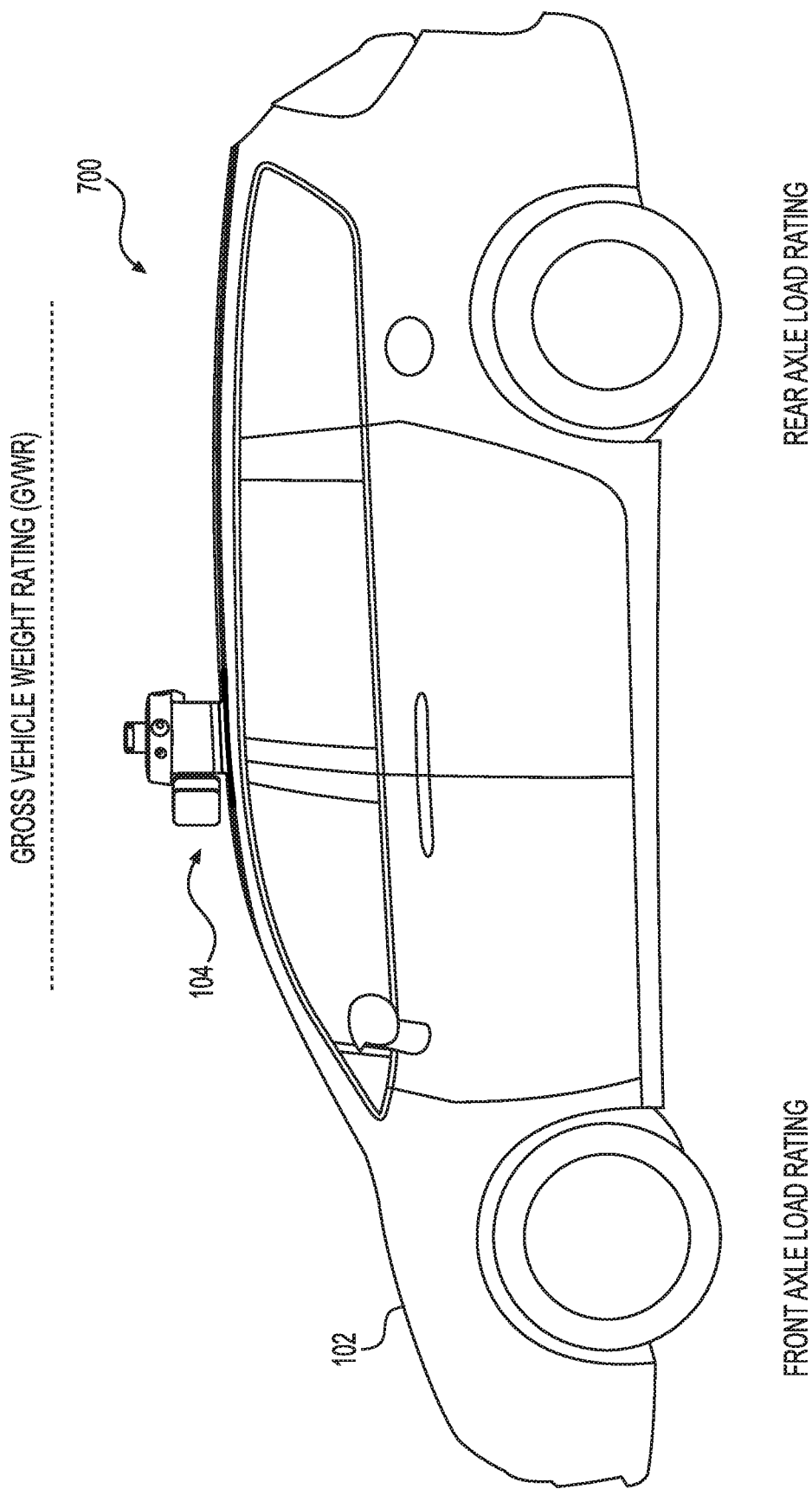
FIG. 7 illustrates an embodiment of a system including a vehicle together with a modular sensor assembly.

FIG. 7 illustrates a system 700, which includes an embodiment of the vehicle 102 together with the modular sensor assembly 104, in accordance with the present disclosed embodiments. Indeed, in some embodiments, the modular sensor assembly 104 may be designed to specific physical weight parameters with respect to the vehicle 102. Specifically, the modular sensor assembly 104 may be designed according to a gross vehicle weight rating (GVWR) (e.g., the maximum total load weight of the vehicle 102, including passenger weight, cargo weight, and the weight of the vehicle 102 itself) of the vehicle 102. For example, in one embodiment, the weight of the modular sensor assembly 104 summed together with the weight of the vehicle 102 (e.g., which may correspond to a minivan, caravan, an SUV, a CUV, an RV, or other similar multi-purpose vehicle) may not exceed approximately 5,000 pounds (lbs.). Thus, provided a GVWR of approximately 6,300 lbs. (e.g., divided evenly as 3,150 lbs. across a front axle 502 and 3,150 lbs. across a rear axle 504 of the vehicle) and a total passenger weight of approximately 1,050 lbs. (e.g., assuming that the vehicle 102 may comfortably seat up to 7 passengers at an average adult human weight of approximately 150 lbs.), the total load weight of the vehicle 102 (e.g., including the total passenger weight, the weight of the modular sensor assembly 104, and the weight of the vehicle 102 itself) may be equal to approximately only 6,000 lbs. Accordingly, by providing a modular sensor assembly 104 designed according to the GVWR of the vehicle 102 on which the modular sensor assembly 104 is to be disposed, the overall safety and driving performance of the vehicle 102 may be markedly improved and the passenger capacity of the vehicle 102 may be maximized for improved utility.

Figure 8:
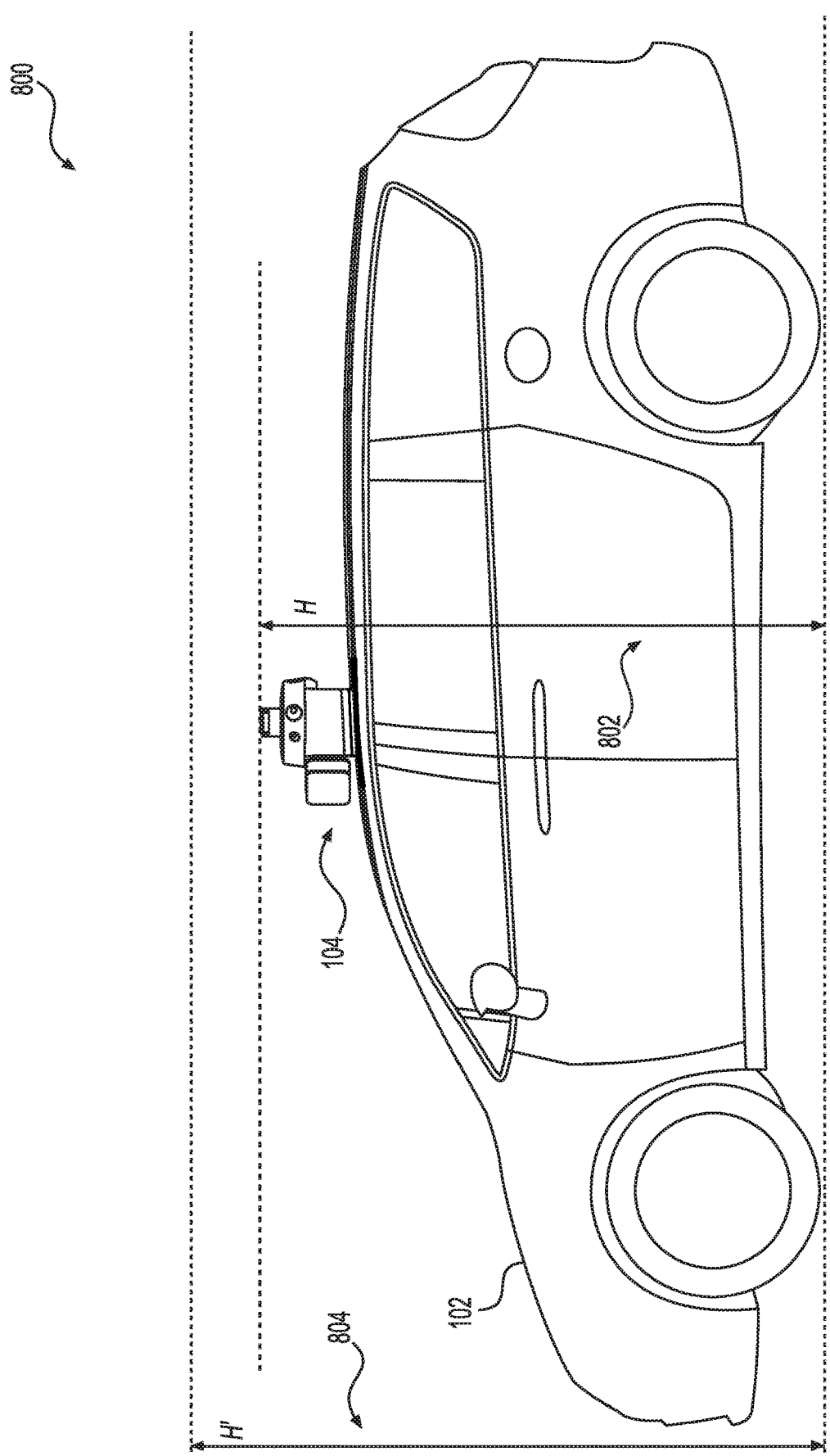
FIG. 8 illustrates another embodiment of a system including a vehicle together with a modular sensor assembly.

FIG. 8 illustrates a system 800, which includes another embodiment of the vehicle 102 together with the modular sensor assembly 104, in accordance with the presently disclosed embodiments. As depicted by FIG. 8, in some embodiments, the modular sensor assembly 104 may be designed in accordance with a predetermined height 802 with respect to the vehicle 102. In some embodiments, the predetermined height 802 may include an overall height, which may be the total height of the modular sensor assembly 104 summed together with the total height (e.g., from ground to rooftop) of the vehicle 102. For example, in some embodiments, as further depicted by FIG. 8, the predetermined height 802 may include any height H that may be less than an overhead clearance threshold 804 (e.g., "H'"). For example, assuming an overhead clearance threshold 804 of approximately 8.5-9 ft. (e.g., industry standard clearance threshold), the modular sensor assembly 104 together with vehicle 102 at the predetermined height 802 (e.g., "H") may be lower than the overhead clearance threshold 804 (e.g., "H'"). In one embodiment, the predetermined height H may include a height of less than or equal to approximately 8 ft., a height of less than or equal to approximately 7.5 ft., a height of less than or equal to approximately 7 ft., a height of less than or equal to approximately 6.5 ft., a height of less than or equal to approximately 6 ft., and so on and so forth. In this way, the vehicle 102 may be allowed to safely proceed through, for example, residential garages, parking garages, tunnels, ferries, drive-thru restaurants, certain overpasses, hangars, car-carrying trailers, auto repair and maintenance shops, and so forth. Additionally, at the predetermined height H, the vehicle 102 may be allowed to be subjected to additional testing scenarios (e.g., wind tunnel testing, thermal chamber testing, anechoic chamber testing, and so forth) that would otherwise be impracticable. Accordingly, by providing a modular sensor assembly 104 designed in accordance with a predetermined height 802, the overall safety and transportation utility of the vehicle 102 may be markedly improved.

Figure 9:
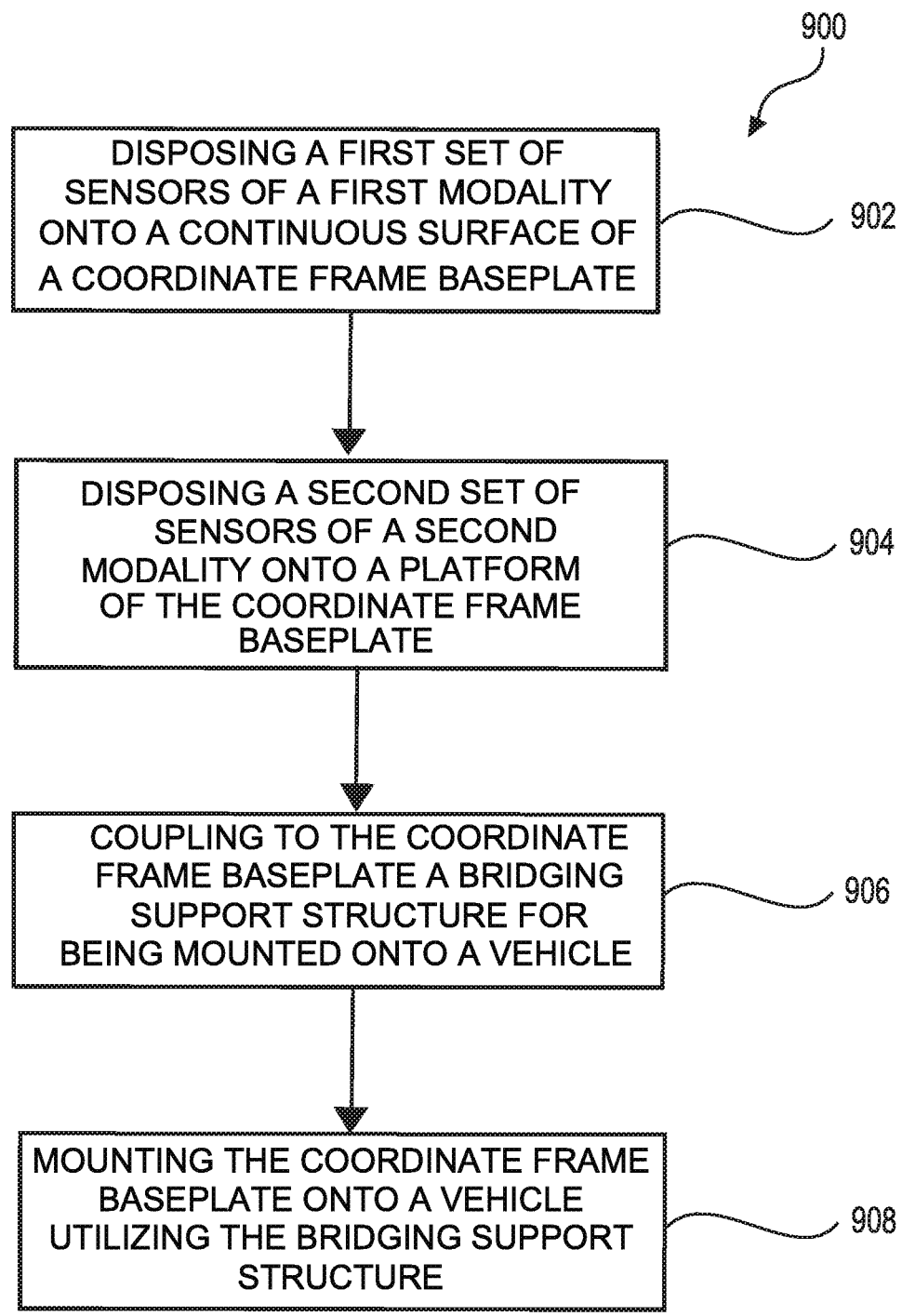
FIG. 9 illustrates a flow diagram of a method for providing a modular sensor assembly for mounting on a vehicle.

FIG. 9 is a flow diagram of a method 900 for providing a modular sensor assembly for mounting on an autonomous or semi-autonomous vehicle, in accordance with the presently disclosed embodiments. The method 900 may begin at block 902 with disposing a first set of sensors of a first modality onto a continuous surface of a coordinate frame baseplate of a modular sensor assembly. For example, as previously discussed above with respect to FIGS. 4A and 4B, the number of wide cameras 430A, 430B, 430C, and 430D, the first narrow camera 432A, the second narrow camera 432B, the first traffic camera 434A, and the second traffic camera 434B may each be disposed onto the continuous surface 417 (e.g., flat surface) of the coordinate frame baseplate 412.

The method 900 may continue at block 904 with modular sensor assembly 104 disposing a second set of sensors of a second modality onto platform surface of the coordinate frame baseplate. For example, as previously discussed above with respect to FIGS. 4A and 4B, the first LiDAR sensor 428A and the second LiDAR sensor 42 may be disposed onto the platform surface 418 (e.g., elevated surface) of the coordinate frame baseplate 412. The method 900 may then continue at block 906 with coupling to the coordinate frame baseplate a bridging support structure for being mounted onto a vehicle. The method 900 may then conclude at block 908 with disposing the coordinate frame baseplate onto a rooftop of a vehicle utilizing the bridging support structure. In this way, the modular sensor assembly 104 may be suitable for scaling production of the vehicle 102 and/or for occasionally retrofitting the vehicle 102, as the modular sensor assembly 104 may be updated, retrofitted, calibrated, and/or exchanged off or onto a particular vehicle 102 without significant disruption to the utility and operation of the vehicle 102.

Figure 10:
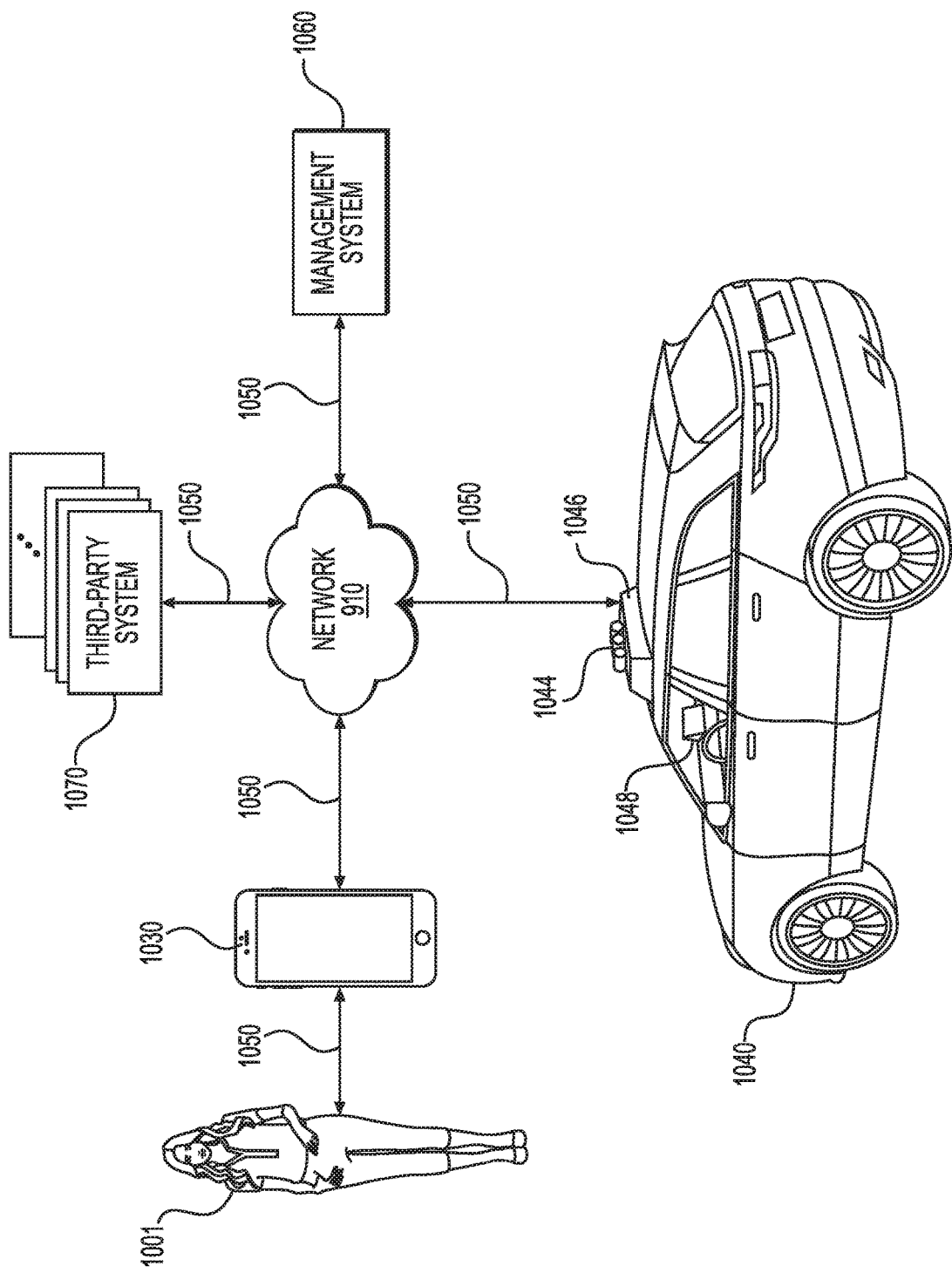
FIG. 10 illustrates an example block diagram of a transportation management environment.

FIG. 10 illustrates an example block diagram of a transportation management environment that may be utilized to perform one or more of the forgoing embodiments as discussed herein. In certain embodiments, the environment may include various computing entities, such as a user computing device 1030 of a user 1001 (e.g., a ride provider or requestor), a transportation management system 1060, an autonomous or semi-autonomous vehicle 1040, and one or more third-party system 1070. The computing entities may be communicatively connected over any suitable network 1010. As an example, and not by way of limitation, one or more portions of network 1010 may include an ad hoc network, an extranet, a virtual private network (VPN), a local area network (LAN), a wireless LAN (WLAN), a wide area network (WAN), a wireless WAN (WWAN), a metropolitan area network (MAN), a portion of the Internet, a portion of Public Switched Telephone Network (PSTN), a cellular network, or a combination of any of the above. In certain embodiments, any suitable network arrangement and protocol enabling the computing entities to communicate with each other may be used. Although FIG. 10 illustrates a single user device 1030, a single transportation management system 1060, a single vehicle 1040, a plurality of third-party systems 1070, and a single network 1010, this disclosure contemplates any suitable number of each of these entities. As an example, and not by way of limitation, the network environment may include multiple users 1001, user devices 1030, transportation management system 1060, autonomous or semi-autonomous vehicles 1040, third-party systems 1070, and networks 910.

The user device 1030, transportation management system 1060, autonomous or semi-autonomous vehicle 1040, and third-party system 1070 may be communicatively connected or co-located with each other in whole or in part. These computing entities may communicate via different transmission technologies and network types. For example, the user device 1030 and the vehicle 1040 may communicate with each other via a cable or short-range wireless communication (e.g., Bluetooth, NFC, WI-FI, etc.), and together they may be connected to the Internet via a cellular network that is accessible to either one of the devices (e.g., the user device 1030 may be a smartphone with LTE connection). The transportation management system 1060 and third-party system 1070, on the other hand, may be connected to the Internet via their respective LAN/WLAN networks and Internet Service Providers (ISP).

FIG. 10 illustrates transmission links 1050 that connect user device 1030, autonomous or semi-autonomous vehicle 1040, transportation management system 1060, and third-party system 1070 to communication network 1010. This disclosure contemplates any suitable transmission links 1050, including, e.g., wire connections (e.g., USB, Lightning, Digital Subscriber Line (DSL) or Data Over Cable Service Interface Specification (DOCSIS)), wireless connections (e.g., WI-FI, WiMAX, cellular, satellite, NFC, Bluetooth), optical connections (e.g., Synchronous Optical Networking (SONET), Synchronous Digital Hierarchy (SDH)), any other wireless communication technologies, and any combination thereof. In certain embodiments, one or more links 1050 may connect to one or more networks 1010, which may include in part, e.g., ad-hoc network, the Intranet, extranet, VPN, LAN, WLAN, WAN, WWAN, MAN, PSTN, a cellular network, a satellite network, or any combination thereof. The computing entities may not necessarily use the same type of transmission link 1050. For example, the user device 1030 may communicate with the transportation management system via a cellular network and the Internet but communicate with the autonomous vehicle 1040 via Bluetooth or a physical wire connection.

In certain embodiments, the transportation management system 1060 may fulfill ride requests for one or more users 1001 by dispatching suitable vehicles. The transportation management system 1060 may receive any number of ride requests from any number of ride requestors 1001. In certain embodiments, a ride request from a ride requestor 1001 may include an identifier that identifies the ride requestor in the system 1060. The transportation management system 1060 may use the identifier to access and store the ride requestor's 1001 information, in accordance with the requestor's 1001 privacy settings. The ride requestor's 1001 information may be stored in one or more data stores (e.g., a relational database system) associated with and accessible to the transportation management system 1060. In certain embodiments, ride requestor information may include profile information about a particular ride requestor 1001.

In certain embodiments, the ride requestor 1001 may be associated with one or more categories or types, through which the ride requestor 1001 may be associated with aggregate information about certain ride requestors of those categories or types. Ride information may include, for example, preferred pick-up and drop-off locations, driving preferences (e.g., safety comfort level, preferred speed, rates of acceleration/deceleration, safety distance from other vehicles when traveling at various speeds, route, etc.), entertainment preferences and settings (e.g., preferred music genre or playlist, audio volume, display brightness, etc.), temperature settings, whether conversation with the driver is welcomed, frequent destinations, historical riding patterns (e.g., time of day of travel, starting and ending locations, etc.), preferred language, age, gender, or any other suitable information. In certain embodiments, the transportation management system 1060 may classify a user 1001 based on known information about the user 1001 (e.g., using machine-learning classifiers), and use the classification to retrieve relevant aggregate information associated with that class. For example, the system 1060 may classify a user 1001 as a young adult and retrieve relevant aggregate information associated with young adults, such as the type of music generally preferred by young adults.

Transportation management system 1060 may also store and access ride information. Ride information may include locations related to the ride, traffic data, route options, optimal pick-up or drop-off locations for the ride, or any other suitable information associated with a ride. As an example, and not by way of limitation, when the transportation management system 1060 receives a request to travel from San Francisco International Airport (SFO) to Palo Alto, Calif., the system 1060 may access or generate any relevant ride information for this particular ride request. The ride information may include, for example, preferred pick-up locations at SFO; alternate pick-up locations in the event that a pick-up location is incompatible with the ride requestor (e.g., the ride requestor may be disabled and cannot access the pick-up location) or the pick-up location is otherwise unavailable due to construction, traffic congestion, changes in pick-up/drop-off rules, or any other reason; one or more routes to navigate from SFO to Palo Alto; preferred off-ramps for a type of user; or any other suitable information associated with the ride.

In certain embodiments, portions of the ride information may be based on historical data associated with historical rides facilitated by the system 1060. For example, historical data may include aggregate information generated based on past ride information, which may include any ride information described herein and telemetry data collected by sensors in autonomous vehicles and/or user devices. Historical data may be associated with a particular user (e.g., that particular user's preferences, common routes, etc.), a category/class of users (e.g., based on demographics), and/or all users of the system 1060. For example, historical data specific to a single user may include information about past rides that particular user has taken, including the locations at which the user is picked up and dropped off, music the user likes to listen to, traffic information associated with the rides, time of the day the user most often rides, and any other suitable information specific to the user. As another example, historical data associated with a category/class of users may include, e.g., common or popular ride preferences of users in that category/class, such as teenagers preferring pop music, ride requestors who frequently commute to the financial district may prefer to listen to the news, etc.

As yet another example, historical data associated with all users may include general usage trends, such as traffic and ride patterns. Using historical data, the system 1060 in certain embodiments may predict and provide ride suggestions in response to a ride request. In certain embodiments, the system 1060 may use machine-learning, such as neural networks, regression algorithms, instance-based algorithms (e.g., k-Nearest Neighbor), decision-tree algorithms, Bayesian algorithms, clustering algorithms, association-rule-learning algorithms, deep-learning algorithms, dimensionality-reduction algorithms, ensemble algorithms, and any other suitable machine-learning algorithms known to persons of ordinary skill in the art. The machine-learning models may be trained using any suitable training algorithm, including supervised learning based on labeled training data, unsupervised learning based on unlabeled training data, and/or semi-supervised learning based on a mixture of labeled and unlabeled training data.

In certain embodiments, transportation management system 1060 may include one or more server computers. Each server may be a unitary server or a distributed server spanning multiple computers or multiple datacenters. The servers may be of various types, such as, for example and without limitation, web server, news server, mail server, message server, advertising server, file server, application server, exchange server, database server, proxy server, another server suitable for performing functions or processes described herein, or any combination thereof. In certain embodiments, each server may include hardware, software, or embedded logic components or a combination of two or more such components for carrying out the appropriate functionalities implemented or supported by the server. In certain embodiments, transportation management system 1060 may include one or more data stores. The data stores may be used to store various types of information, such as ride information, ride requestor information, ride provider information, historical information, third-party information, or any other suitable type of information. In certain embodiments, the information stored in the data stores may be organized according to specific data structures. In certain embodiments, each data store may be a relational, columnar, correlation, or any other suitable type of database system. Although this disclosure describes or illustrates particular types of databases, this disclosure contemplates any suitable types of databases. Certain embodiments may provide interfaces that enable a user device 1030 (which may belong to a ride requestor or provider), a transportation management system 1060, vehicle system 1040, or a third-party system 1070 to process, transform, manage, retrieve, modify, add, or delete the information stored in the data store.

In certain embodiments, transportation management system 1060 may include an authorization server (or any other suitable component(s)) that allows users 1001 to opt-in to or opt-out of having their information and actions logged, recorded, or sensed by transportation management system 1060 or shared with other systems (e.g., third-party systems 1070). In certain embodiments, a user 1001 may opt-in or opt-out by setting appropriate privacy settings. A privacy setting of a user may determine what information associated with the user may be logged, how information associated with the user may be logged, when information associated with the user may be logged, who may log information associated with the user, whom information associated with the user may be shared with, and for what purposes information associated with the user may be logged or shared. Authorization servers may be used to enforce one or more privacy settings of the users 1001 of transportation management system 1060 through blocking, data hashing, anonymization, or other suitable techniques as appropriate.

In certain embodiments, third-party system 1070 may be a network-addressable computing system that may provide HD maps or host GPS maps, customer reviews, music or content, weather information, or any other suitable type of information. Third-party system 1070 may generate, store, receive, and send relevant data, such as, for example, map data, customer review data from a customer review website, weather data, or any other suitable type of data. Third-party system 1070 may be accessed by the other computing entities of the network environment either directly or via network 1010. For example, user device 1030 may access the third-party system 1070 via network 1010, or via transportation management system 1060. In the latter case, if credentials are to be accessed the third-party system 1070, the user 1001 may provide such information to the transportation management system 1060, which may serve as a proxy for accessing content from the third-party system 1070.

In certain embodiments, user device 1030 may be a mobile computing device such as a smartphone, tablet computer, or laptop computer. User device 1030 may include one or more processors (e.g., CPU and/or GPU), memory, and storage. An operating system and applications may be installed on the user device 1030, such as, e.g., a transportation application associated with the transportation management system 1060, applications associated with third-party systems 1070, and applications associated with the operating system. User device 1030 may include functionality for determining its location, direction, or orientation, based on integrated sensors such as GPS, compass, gyroscope, or accelerometer. User device 1030 may also include wireless transceivers for wireless communication and may support wireless communication protocols such as Bluetooth, near-field communication (NFC), infrared (IR) communication, WI-FI, and/or 2G/3G/4G/LTE/5G mobile communication standard. User device 1030 may also include one or more cameras, scanners, touchscreens, microphones, speakers, and any other suitable input-output devices.

In certain embodiments, the vehicle 1040 may be an autonomous or semi-autonomous vehicle and equipped with an array of sensors 1044, a navigation system 1046, and a ride-service computing device 1048. In certain embodiments, a fleet of autonomous or semi-autonomous vehicles 1040 may be managed by the transportation management system 1060. The fleet of autonomous vehicles 1040, in whole or in part, may be owned by the entity associated with the transportation management system 1060, or they may be owned by a third-party entity relative to the transportation management system 1060. In either case, the transportation management system 1060 may control the operations of the autonomous vehicles 1040, including, e.g., dispatching select vehicles 1040 to fulfill ride requests, instructing the vehicles 1040 to perform select operations (e.g., head to a service center or charging/fueling station, pull over, stop immediately, self-diagnose, lock/unlock compartments, change music station, change temperature, and any other suitable operations), and instructing the vehicles 1040 to enter select operation modes (e.g., operate normally, drive at a reduced speed, drive under the command of human operators, and any other suitable operational modes).

In certain embodiments, the autonomous or semi-autonomous vehicles 1040 may receive data from and transmit data to the transportation management system 1060 and the third-party system 1070. Example of received data may include, e.g., instructions, new software or software updates, maps, 3-D models, trained or untrained machine-learning models, location information (e.g., location of the ride requestor, the autonomous or semi-autonomous vehicle 1040 itself, other vehicles 1040, and target destinations such as service centers), navigation information, traffic information, weather information, entertainment content (e.g., music, video, and news) ride requestor information, ride information, and any other suitable information. Examples of data transmitted from the autonomous or semi-autonomous vehicle 1040 may include, e.g., telemetry and sensor data, determinations/decisions based on such data, vehicle condition or state (e.g., battery/fuel level, tire and brake conditions, sensor condition, speed, odometer, etc.), location, navigation data, passenger inputs (e.g., through a user interface in the vehicle 1040, passengers may send/receive data to the transportation management system 1060 and/or third-party system 1070), and any other suitable data.

In certain embodiments, autonomous or semi-autonomous vehicles 1040 may also communicate with each other as well as other traditional human-driven vehicles, including those managed and not managed by the transportation management system 1060. For example, one vehicle 1040 may communicate with another vehicle data regarding their respective location, condition, status, sensor reading, and any other suitable information. In certain embodiments, vehicle-to-vehicle communication may take place over direct short-range wireless connection (e.g., WI-FI, Bluetooth, NFC) and/or over a network (e.g., the Internet or via the transportation management system 1060 or third-party system 1070).

In certain embodiments, an autonomous or semi-autonomous vehicle 1040 may obtain and process sensor/telemetry data. Such data may be captured by any suitable sensors. For example, the vehicle 1040 may have a LiDAR sensor array of multiple LiDAR transceivers that are configured to rotate 360°, emitting pulsed laser light and measuring the reflected light from objects surrounding vehicle 1040. In certain embodiments, LiDAR transmitting signals may be steered by use of a gated light valve, which may be a MEMs device that directs a light beam using the principle of light diffraction. Such a device may not use a gimbaled mirror to steer light beams in 360° around the autonomous or semi-autonomous vehicle. Rather, the gated light valve may direct the light beam into one of several optical fibers, which may be arranged such that the light beam may be directed to many discrete positions around the autonomous or semi-autonomous vehicle. Thus, data may be captured in 360° around the autonomous or semi-autonomous vehicle, but no rotating parts may be necessary. A LiDAR is an effective sensor for measuring distances to targets, and as such may be used to generate a 3-D model of the external environment of the autonomous or semi-autonomous vehicle 1040. As an example, and not by way of limitation, the 3-D model may represent the external environment including objects such as other cars, curbs, debris, objects, and pedestrians up to a maximum range of the sensor arrangement (e.g., 50 meters, 100 meters, or 200 meters).

As another example, the autonomous or semi-autonomous vehicle 1040 may have optical cameras pointing in different directions. The cameras may be used for, e.g., recognizing roads, lane markings, street signs, traffic lights, police, other vehicles, and any other visible objects of interest. To enable the vehicle 1040 to "see" at night, infrared cameras may be installed. In certain embodiments, the vehicle may be equipped with stereo vision for, e.g., spotting hazards such as pedestrians or tree branches on the road. As another example, the vehicle 1040 may have radars for, e.g., detecting other vehicles and/or hazards afar. Furthermore, the vehicle 1040 may have ultrasound equipment for, e.g., parking and obstacle detection. In addition to sensors enabling the vehicle 1040 to detect, measure, and understand the external world around it, the vehicle 1040 may further be equipped with sensors for detecting and self-diagnosing the vehicle's own state and condition. For example, the vehicle 1040 may have wheel sensors for, e.g., measuring velocity; global positioning system (GPS) for, e.g., determining the vehicle's current geolocation; and/or inertial measurement units, accelerometers, gyroscopes, and/or odometer systems for movement or motion detection.

While the description of these sensors provides particular examples of utility, one of ordinary skill in the art would appreciate that the utilities of the sensors are not limited to those examples. Further, while an example of a utility may be described with respect to a particular type of sensor, it should be appreciated that the utility may be achieved using any combination of sensors. For example, an autonomous vehicle 1040 may build a 3-D model of its surrounding based on data from its LiDAR, radar, sonar, and cameras, along with a pre-generated map obtained from the transportation management system 1060 or the third-party system 1070. Although sensors 1044 appear in a particular location on autonomous vehicle 1040 in FIG. 10, sensors 1044 may be located in any suitable location in or on the autonomous or semi-autonomous vehicle 1040. Example locations for sensors include the front and rear bumpers, the doors, the front windshield, on the side panel, or any other suitable location.

In certain embodiments, the autonomous vehicle 1040 may be equipped with a processing unit (e.g., one or more CPUs and GPUs), memory, and storage. The vehicle 1040 may thus be equipped to perform a variety of computational and processing tasks, including processing the sensor data, extracting useful information, and operating accordingly. For example, based on images captured by its cameras and a machine-vision model, the vehicle 1040 may identify particular types of objects captured by the images, such as pedestrians, other vehicles, lanes, curbs, and any other objects of interest. In certain embodiments, the autonomous vehicle 1040 may have a navigation system 1046 responsible for safely navigating the autonomous vehicle 1040. In certain embodiments, the navigation system 1046 may take as input any type of sensor data from, e.g., a Global Positioning System (GPS) module, inertial measurement unit (IMU), LiDAR sensors, optical cameras, radio frequency (RF) transceivers, or any other suitable telemetry or sensory mechanisms. The navigation system 1046 may also utilize, e.g., map data, traffic data, accident reports, weather reports, instructions, target destinations, and any other suitable information to determine navigation routes and particular driving operations (e.g., slowing down, speeding up, stopping, swerving, etc.). In certain embodiments, the navigation system 1046 may use its determinations to control the vehicle 1040 to operate in prescribed manners and to guide the autonomous vehicle 1040 to its destinations without colliding into other objects. Although the physical embodiment of the navigation system 1046 (e.g., the processing unit) appears in a particular location on autonomous vehicle 1040 in FIG. 10, navigation system 1046 may be located in any suitable location in or on autonomous vehicle 1040. Example locations for navigation system 1046 include inside the cabin or passenger compartment of autonomous vehicle 1040, near the engine/battery, near the front seats, rear seats, or in any other suitable location.

In certain embodiments, the autonomous or semi-autonomous vehicle 1040 may be equipped with a ride-service computing device 1048, which may be a tablet computer, or any other suitable device installed by transportation management system 1060 to allow the user to interact with the autonomous vehicle 1040, transportation management system 1060, other users 1001, or third-party systems 1070. In certain embodiments, installation of ride-service computing device 1048 may be accomplished by placing the ride-service computing device 1048 inside autonomous vehicle 1040, and further configuring it to communicate with the vehicle 1040 via a wire or wireless connection (e.g., via Bluetooth). Although FIG. 10 illustrates a single ride-service computing device 1048 at a particular location in autonomous vehicle 1040, autonomous or semi-autonomous vehicle 1040 may include several ride-service computing devices 1048 in several different locations within the vehicle.

As an example, and not by way of limitation, the autonomous or semi-autonomous vehicle 1040 may include four ride-service computing devices 1048 located in the following places: one in front of the front-left passenger seat (e.g., driver's seat in traditional U.S. automobiles), one in front of the front-right passenger seat, one in front of each of the rear-left and rear-right passenger seats. In certain embodiments, ride-service computing device 1048 may be detachable from any component of autonomous vehicle 1040. This may allow users to handle ride-service computing device 1048 in a manner consistent with other tablet computing devices. As an example, and not by way of limitation, a user may move ride-service computing device 1048 to any location in the cabin or passenger compartment of the autonomous or semi-autonomous vehicle 1040, may hold ride-service computing device 1048, or handle ride-service computing device 1048 in any other suitable manner. Although this disclosure describes providing a particular computing device in a particular manner, this disclosure contemplates providing any suitable computing device in any suitable manner.

Figure 11:
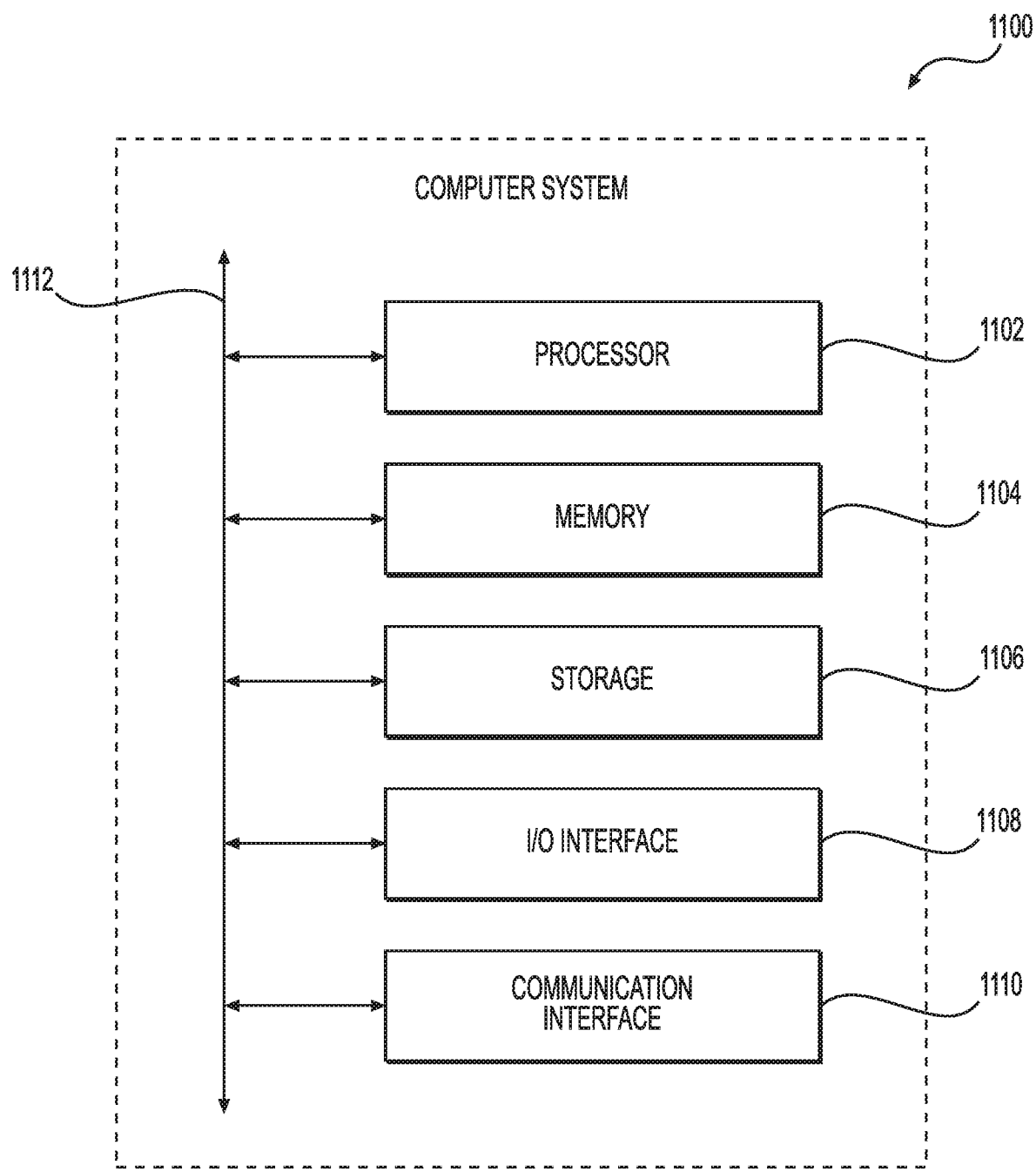
FIG. 11 illustrates an example of a computing system.

FIG. 11 illustrates an example computer system 1100 that may be utilized to perform one or more of the forgoing embodiments as discussed herein. In certain embodiments, one or more computer systems 1100 perform one or more steps of one or more methods described or illustrated herein. In certain embodiments, one or more computer systems 1100 provide the functionalities described or illustrated herein. In certain embodiments, software running on one or more computer systems 1100 performs one or more steps of one or more methods described or illustrated herein or provides the functionalities described or illustrated herein. Certain embodiments include one or more portions of one or more computer systems 1100. Herein, a reference to a computer system may encompass a computing device, and vice versa, where appropriate. Moreover, a reference to a computer system may encompass one or more computer systems, where appropriate.

This disclosure contemplates any suitable number of computer systems 1100. This disclosure contemplates computer system 1100 taking any suitable physical form. As example and not by way of limitation, computer system 1100 may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, a tablet computer system, an augmented/virtual reality device, or a combination of two or more of these. Where appropriate, computer system 1100 may include one or more computer systems 1100; be unitary or distributed; span multiple locations; span multiple machines; span multiple data centers; or reside in a cloud, which may include one or more cloud components in one or more networks. Where appropriate, one or more computer systems 1100 may perform without substantial spatial or temporal limitation one or more steps of one or more methods described or illustrated herein. As an example, and not by way of limitation, one or more computer systems 1100 may perform in real time or in batch mode one or more steps of one or more methods described or illustrated herein. One or more computer systems 1100 may perform at different times or at different locations one or more steps of one or more methods described or illustrated herein, where appropriate.

In certain embodiments, computer system 1100 includes a processor 1102, memory 1104, storage 1106, an input/output (I/O) interface 1108, a communication interface 1110, and a bus 1112. Although this disclosure describes and illustrates a particular computer system having a particular number of particular components in a particular arrangement, this disclosure contemplates any suitable computer system having any suitable number of any suitable components in any suitable arrangement. In certain embodiments, processor 1102 includes hardware for executing instructions, such as those making up a computer program. As an example, and not by way of limitation, to execute instructions, processor 1102 may retrieve (or fetch) the instructions from an internal register, an internal cache, memory 1104, or storage 1106; decode and execute them; and then write one or more results to an internal register, an internal cache, memory 1104, or storage 1106. In certain embodiments, processor 1102 may include one or more internal caches for data, instructions, or addresses.

This disclosure contemplates processor 1102 including any suitable number of any suitable internal caches, where appropriate. As an example, and not by way of limitation, processor 1102 may include one or more instruction caches, one or more data caches, and one or more translation lookaside buffers (TLBs). Instructions in the instruction caches may be copies of instructions in memory 1104 or storage 1106, and the instruction caches may speed up retrieval of those instructions by processor 1102. Data in the data caches may be copies of data in memory 1104 or storage 1106 that are to be operated on by computer instructions; the results of previous instructions executed by processor 1102 that are accessible to subsequent instructions or for writing to memory 1104 or storage 1106; or any other suitable data. The data caches may speed up read or write operations by processor 1102. The TLBs may speed up virtual-address translation for processor 1102. In certain embodiments, processor 1102 may include one or more internal registers for data, instructions, or addresses. This disclosure contemplates processor 1102 including any suitable number of any suitable internal registers, where appropriate. Where appropriate, processor 1102 may include one or more arithmetic logic units (ALUs), be a multi-core processor, or include one or more processors 902. Although this disclosure describes and illustrates a particular processor, this disclosure contemplates any suitable processor.

In certain embodiments, memory 1104 includes main memory for storing instructions for processor 1102 to execute or data for processor 1102 to operate on. As an example, and not by way of limitation, computer system 1100 may load instructions from storage 1106 or another source (such as another computer system 1100) to memory 1104. Processor 1102 may then load the instructions from memory 1104 to an internal register or internal cache. To execute the instructions, processor 1102 may retrieve the instructions from the internal register or internal cache and decode them. During or after execution of the instructions, processor 1102 may write one or more results (which may be intermediate or final results) to the internal register or internal cache. Processor 1102 may then write one or more of those results to memory 1104. In certain embodiments, processor 1102 executes only instructions in one or more internal registers or internal caches or in memory 1104 (as opposed to storage 1106 or elsewhere) and operates only on data in one or more internal registers or internal caches or in memory 1104 (as opposed to storage 1106 or elsewhere). One or more memory buses (which may each include an address bus and a data bus) may couple processor 1102 to memory 1104. Bus 1112 may include one or more memory buses, as described in further detail below. In certain embodiments, one or more memory management units (MMUs) reside between processor 1102 and memory 1104 and facilitate accesses to memory 1104 requested by processor 1102. In certain embodiments, memory 1104 includes random access memory (RAM). This RAM may be volatile memory, where appropriate. Where appropriate, this RAM may be dynamic RAM (DRAM) or static RAM (SRAM). Moreover, where appropriate, this RAM may be single-ported or multi-ported RAM. This disclosure contemplates any suitable RAM. Memory 1104 may include one or more memories 904, where appropriate. Although this disclosure describes and illustrates particular memory, this disclosure contemplates any suitable memory.

In certain embodiments, storage 1106 includes mass storage for data or instructions. As an example, and not by way of limitation, storage 1106 may include a hard disk drive (HDD), a floppy disk drive, flash memory, an optical disc, a magneto-optical disc, magnetic tape, or a Universal Serial Bus (USB) drive or a combination of two or more of these. Storage 1106 may include removable or non-removable (or fixed) media, where appropriate. Storage 1106 may be internal or external to computer system 1100, where appropriate. In certain embodiments, storage 1106 is non-volatile, solid-state memory. In certain embodiments, storage 1106 includes read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. This disclosure contemplates mass storage 1106 taking any suitable physical form. Storage 1106 may include one or more storage control units facilitating communication between processor 1102 and storage 1106, where appropriate. Where appropriate, storage 1106 may include one or more storages 906. Although this disclosure describes and illustrates particular storage, this disclosure contemplates any suitable storage.

In certain embodiments, I/O interface 1108 includes hardware, software, or both, providing one or more interfaces for communication between computer system 1100 and one or more I/O devices. Computer system 1100 may include one or more of these I/O devices, where appropriate. One or more of these I/O devices may enable communication between a person and computer system 1100. As an example, and not by way of limitation, an I/O device may include a keyboard, keypad, microphone, monitor, mouse, printer, scanner, speaker, still camera, stylus, tablet, touch screen, trackball, video camera, another suitable I/O device or a combination of two or more of these. An I/O device may include one or more sensors. This disclosure contemplates any suitable I/O devices and any suitable I/O interfaces 1108 for them. Where appropriate, I/O interface 1108 may include one or more device or software drivers enabling processor 1102 to drive one or more of these I/O devices. I/O interface 1108 may include one or more I/O interfaces 1108, where appropriate. Although this disclosure describes and illustrates a particular I/O interface, this disclosure contemplates any suitable I/O interface.

In certain embodiments, communication interface 1110 includes hardware, software, or both providing one or more interfaces for communication (such as, for example, packet-based communication) between computer system 1100 and one or more other computer systems 1100 or one or more networks. As an example, and not by way of limitation, communication interface 1110 may include a network interface controller (NIC) or network adapter for communicating with an Ethernet or any other wire-based network or a wireless NIC (WNIC) or wireless adapter for communicating with a wireless network, such as a WI-FI network. This disclosure contemplates any suitable network and any suitable communication interface 1110 for it. As an example, and not by way of limitation, computer system 1100 may communicate with an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As an example, computer system 1100 may communicate with a wireless PAN (WPAN) (such as, for example, a Bluetooth WPAN), a WI-FI network, a WI-MAX network, a cellular telephone network (such as, for example, a Global System for Mobile Communications (GSM) network), or any other suitable wireless network or a combination of two or more of these. Computer system 1100 may include any suitable communication interface 1110 for any of these networks, where appropriate. Communication interface 1110 may include one or more communication interfaces 910, where appropriate. Although this disclosure describes and illustrates a particular communication interface, this disclosure contemplates any suitable communication interface.

In certain embodiments, bus 1112 includes hardware, software, or both coupling components of computer system 1100 to each other. As an example and not by way of limitation, bus 1112 may include an Accelerated Graphics Port (AGP) or any other graphics bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local (VLB) bus, or another suitable bus or a combination of two or more of these. Bus 1112 may include one or more buses 912, where appropriate. Although this disclosure describes and illustrates a particular bus, this disclosure contemplates any suitable bus or interconnect.

Herein, a computer-readable non-transitory storage medium or media may include one or more semiconductor-based or other types of integrated circuits (ICs) (such as field-programmable gate arrays (FPGAs) or application-specific ICs (ASICs)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative. Additionally, although this disclosure describes or illustrates certain embodiments as providing particular advantages, certain embodiments may provide none, some, or all of these advantages.

What is claimed is:

1. A modular sensor assembly configured for mounting on a vehicle, the modular sensor assembly comprising:
   a first set of sensors;
   a second set of sensors;
   a coordinate frame baseplate, comprising:
      a body having a continuous surface;
      one or more sensor mounting elements coupled to the continuous surface of the body, the one or more sensor mounting elements configured for mounting the first set of sensors at a first height; and
      a sensor platform coupled to the body and overlaying the continuous surface of the body, the sensor platform configured for mounting the second set of sensors at a second height, wherein the first set of sensors and the second set of sensors are coupled to the coordinate frame baseplate so as to impart a common coordinate frame for the first set of sensors mounted at the first height and the second set of sensors mounted at the second height; and
   a bridging support structure capable of being mounted on a vehicle, the bridging support structure including (1) a first support structure coupled to a first end of the coordinate frame baseplate, and (2) a second support structure coupled to a second end of the coordinate frame baseplate, such that the bridging support structure elevates at least a portion of the coordinate frame baseplate relative to the first support structure and the second support structure.

2. The modular sensor assembly of claim 1, wherein the common coordinate frame imparted for the first set of sensors and the second set of sensors corresponds to:
   the first set of sensors and the second set of sensors being calibrated to a calibration point corresponding to at least the coordinate frame baseplate.

3. The modular sensor assembly of claim 1, wherein the first set of sensors comprises at least a first camera and a second camera, and wherein the first camera corresponds to a wide field of view (FOV) camera and the second camera corresponds to a narrow FOV camera.

4. The modular sensor assembly of claim 1, the coordinate frame baseplate further comprising:
   a first bracket component mounted via a first end of the first bracket component to the coordinate frame baseplate, the first bracket component being coupled further via a second end of the first bracket component to a first sensor different from the first set of sensors and the second set of sensors; and
   a second bracket component mounted via a first end of the second bracket component to the coordinate frame baseplate, the second bracket component being coupled further via a second end of the second bracket component to a second sensor different from the first set of sensors and the second set of sensors.

5. The modular sensor assembly of claim 4, wherein:
   the first bracket component is mounted via the first end of the first bracket component to a first portion of the coordinate frame baseplate so that the first sensor is mounted at a third height; and
   the second bracket component is mounted via the first end of the second bracket component to a second portion of the coordinate frame baseplate so that the second sensor is mounted at the third height, wherein the first bracket component and the second bracket component are mounted to the coordinate frame baseplate so as to impart the common coordinate frame for the first sensor and the second sensor at the third height.

6. The modular sensor assembly of claim 1, wherein the first set of sensors are capable of imparting a first sensor coverage at the first height and the second set of sensors are capable of imparting a second sensor coverage at the second height.

7. The modular sensor assembly of claim 6, wherein, due to the first height being different from the second height, the first sensor coverage is free of interference from the second sensor coverage.

8. The modular sensor assembly of claim 1, wherein the first end of the coordinate frame baseplate is opposite the second end of the coordinate frame baseplate.

9. The modular sensor assembly of claim 1, the bridging support structure further comprising:
   a first rail attachment piece coupled to an end of the first support structure, the first rail attachment piece being configured for detachably mounting the first support structure atop the vehicle; and
   a second rail attachment piece coupled to an end of the second support structure, the second rail attachment piece being configured for detachably mounting the second support structure atop the vehicle.

10. A method of providing a modular sensor assembly for mounting on a vehicle, the method comprising:
   mounting a first set of sensors to a continuous surface of a coordinate frame baseplate, wherein the first set of sensors are mounted at a first height relative to the continuous surface of the coordinate frame baseplate;

mounting a second set of sensors onto a sensor platform that is coupled to the coordinate frame baseplate, wherein the sensor platform overlays the continuous surface of the coordinate frame baseplate so as to mount the second set of sensors at a second height relative to the continuous surface, wherein the first set of sensors and the second set of sensors are coupled to the coordinate frame baseplate so as to impart a common coordinate frame for the first set of sensors mounted at the first height and the second set of sensors mounted at the second height; and coupling the coordinate frame baseplate to a bridging support structure capable of being mounted on a vehicle, the bridging support structure including (1) a first support structure coupled to a first end of the coordinate frame baseplate, and (2) a second support structure coupled to a second end of the coordinate frame baseplate, wherein the bridging support structure elevates at least a portion of the coordinate frame baseplate relative to the first support structure and the second support structure.

11. The method of claim 10, further comprising:
mounting a first bracket component via a first end of the first bracket component to the coordinate frame baseplate, the first bracket component being coupled further via a second end of the first bracket component to a first sensor different from the first set of sensors and the second set of sensors; and
mounting a second bracket component via a first end of the second bracket component to the coordinate frame baseplate, the second bracket component being coupled further via a second end of the second bracket component to a second sensor different from the first set of sensors and the second set of sensors.

12. The method of claim 10, further comprising:
prior to mounting the coordinate frame baseplate onto the vehicle:
calibrating the first set of sensors to a calibration point corresponding to at least to the coordinate frame baseplate; and
calibrating the second set of sensors to a calibration point corresponding at least to the coordinate frame baseplate.

13. The method of claim 10, wherein the first set of sensors are capable of emitting a first sensor coverage and the second set of sensors are capable of emitting a second sensor coverage, and the first sensor coverage and the second sensor coverage are free of interference from the bridging support structure.

14. The method of claim 13, wherein the first support structure and the second support structure of the bridging support structure are angled away from the continuous surface of the coordinate frame baseplate so that the first sensor coverage and the second sensor coverage are free of interference from the bridging support structure.

15. A system for a vehicle, the system comprising:
a first set of sensors;
a second set of sensors;
a coordinate frame baseplate, comprising:
a body including a continuous surface,
a mounting element coupled to the body, the mounting element capable of mounting the first set of sensors at a first height, and
a bracket component coupled to and extending from the body, the bracket component capable of mounting the second set of sensors at a second height, wherein the first set of sensors and second set of sensors are coupled to the coordinate frame baseplate so as to impart a common coordinate frame for the first set of sensors mounted at the first height and the second set of sensors mounted at the second height; and
a bridging support structure coupled to the body of the coordinate frame baseplate, wherein the bridging structure is capable of mounting the coordinate frame baseplate on the vehicle.

16. The system of claim 15, wherein the coordinate frame baseplate further comprises:
a sensor platform overlaying the continuous surface of the body, wherein a third set of sensors are mounted on the sensor platform at a third height, and the sensor platform is coupled to the coordinate frame baseplate so as to impart the common coordinate frame for the third set of sensors mounted at the third height.

17. The system of claim 15, wherein the mounting element imparts the first set of sensors with a first sensor coverage and the bracket component imparts the second set of sensors with a second sensor coverage, and the first height is different than the second height so that the first sensor coverage is free of occlusion by the second sensor coverage.

18. The system of claim 17, wherein the bridging support structure includes a first support structure and a second support structure, and the first support structure and the second support structure are angled away from the continuous surface of the body so that the first sensor coverage and the second sensor coverage are free of interference from the bridging support structure.

19. The system of claim 15, wherein the common coordinate frame corresponds to the first set of sensors and the second set of sensors being calibrated to a calibration point corresponding at least to the coordinate frame baseplate.

20. The system of claim 15, wherein the bridging support structure further comprises:
a first rail attachment piece coupled to a first end of the bridging support structure; and
a second rail attachment piece coupled to a second end of the bridging support structure, wherein the first end is opposite the second end.

* * * * *